US008253066B2

(12) United States Patent
Gu et al.

(10) Patent No.: US 8,253,066 B2
(45) Date of Patent: Aug. 28, 2012

(54) LASER-BASED METHOD AND SYSTEM FOR REMOVING ONE OR MORE TARGET LINK STRUCTURES

(75) Inventors: Bo Gu, North Andover, MA (US); Donald V. Smart, Boston, MA (US); James J. Cordingley, Littleton, MA (US); Joohan Lee, Andover, MA (US); Donald J. Svetkoff, Ann Arbor, MI (US); Shepard D. Johnson, Andover, MA (US); Jonathan S. Ehrmann, Sudbury, MA (US)

(73) Assignee: GSI Group Corporation, Bedford, MA (US)

(*) Notice: Subject to any disclaimer, the term of this patent is extended or adjusted under 35 U.S.C. 154(b) by 0 days.

(21) Appl. No.: 12/950,969

(22) Filed: Nov. 19, 2010

(65) Prior Publication Data
US 2011/0062127 A1 Mar. 17, 2011

Related U.S. Application Data

(63) Continuation of application No. 11/700,386, filed on Jan. 31, 2007, now Pat. No. 7,838,794, which is a continuation-in-part of application No. 10/683,086, filed on Oct. 10, 2003, now Pat. No. 7,723,642, which is a continuation-in-part of application No. 09/941,389, filed on Aug. 28, 2001, now Pat. No. 6,727,458, and a continuation of application No. 09/473,926, filed on Dec. 28, 1999, now Pat. No. 6,281,471, said application No. 11/700,386 is a continuation-in-part of application No. 10/107,890, filed on Mar. 27, 2002.

(60) Provisional application No. 60/765,401, filed on Feb. 3, 2006, provisional application No. 60/279,644, filed on Mar. 29, 2001.

(51) Int. Cl.
*H01S 3/10* (2006.01)
(52) U.S. Cl. ............... 219/121.68; 219/121.69; 438/132; 250/492.2; 372/25
(58) Field of Classification Search ............. 219/121.68, 219/121.69; 438/128–132, 940; 250/492.2; 372/25; 29/847
See application file for complete search history.

(56) References Cited

U.S. PATENT DOCUMENTS 3,740,523 A 6/1973 Cohen et al.
(Continued)

FOREIGN PATENT DOCUMENTS

EP 0 902 474 3/1999
(Continued)

OTHER PUBLICATIONS

Anderson, Stephen G., Solid-State UV Lasers Drill Vias Effectively, Laser Focus World, Feb. 1996, pp. 31-32.
(Continued)

*Primary Examiner* — Samuel M Heinrich
(74) *Attorney, Agent, or Firm* — Knobbe, Martens, Olson & Bear LLP

(57) ABSTRACT

Laser-based methods and systems for removing one or more target link structures of a circuit fabricated on a substrate includes generating a pulsed laser output at a predetermined wavelength less than an absorption edge of the substrate are provided. The laser output includes at least one pulse having a pulse duration in the range of about 10 picoseconds to less than 1 nanosecond, the pulse duration being within a thermal laser processing range. The method also includes delivering and focusing the laser output onto the target link structure. The focused laser output has sufficient power density at a location within the target link structure to reduce the reflectivity of the target link structure and efficiently couple the focused laser output into the target link structure to remove the target link structure without damaging the substrate.

40 Claims, 15 Drawing Sheets

U.S. PATENT DOCUMENTS

| | | | |
|---|---|---|---|
| 3,806,829 A | 4/1974 | Duston et al. | |
| 3,869,210 A | 3/1975 | Fletcher et al. | |
| 4,044,222 A | 8/1977 | Kestenbaum | |
| 4,114,018 A | 9/1978 | Allmen et al. | |
| 4,397,527 A | 8/1983 | Geyer | |
| 4,399,345 A | 8/1983 | Lapham et al. | |
| 4,410,237 A | 10/1983 | Veldkamp | |
| 4,414,059 A | 11/1983 | Blum et al. | |
| 4,467,172 A | 8/1984 | Ehrenwald et al. | |
| 4,483,005 A | 11/1984 | Smart | |
| 4,492,843 A | 1/1985 | Miller et al. | |
| 4,532,402 A | 7/1985 | Overbeck | |
| 4,602,852 A | 7/1986 | Moroz | |
| 4,646,308 A | 2/1987 | Kafka et al. | |
| 4,742,522 A | 5/1988 | Linford | |
| 4,780,177 A | 10/1988 | Wojnarowski et al. | |
| 4,826,785 A | 5/1989 | McClure et al. | |
| 4,827,325 A | 5/1989 | Or-bach et al. | |
| 4,861,964 A | 8/1989 | Sinohara | |
| 4,872,140 A | 10/1989 | Graham et al. | |
| 4,878,222 A | 10/1989 | Lawrence | |
| 4,914,663 A | 4/1990 | Basu et al. | |
| 4,918,284 A | 4/1990 | Weisz | |
| 4,932,031 A | 6/1990 | Alfano et al. | |
| 4,935,801 A | 6/1990 | McClure et al. | |
| 4,941,093 A | 7/1990 | Marshall et al. | |
| 5,005,946 A | 4/1991 | Brandstetter | |
| 5,021,362 A | 6/1991 | Chlipala | |
| 5,034,951 A | 7/1991 | Edelstein et al. | |
| 5,042,040 A | 8/1991 | Harvey et al. | |
| 5,059,764 A | 10/1991 | Baer | |
| 5,175,664 A | 12/1992 | Diels et al. | |
| 5,197,074 A | 3/1993 | Emmons, Jr. et al. | |
| 5,201,437 A | 4/1993 | Burgdorf | |
| 5,208,437 A | 5/1993 | Miyauchi et al. | |
| 5,236,551 A | 8/1993 | Pan | |
| 5,265,114 A | 11/1993 | Sun et al. | |
| 5,268,911 A | 12/1993 | Young | |
| 5,280,491 A | 1/1994 | Lai | |
| 5,293,025 A | 3/1994 | Wang | |
| 5,294,567 A | 3/1994 | Dorfman | |
| 5,300,756 A | 4/1994 | Cordingley | |
| 5,312,396 A * | 5/1994 | Feld et al. | 606/11 |
| 5,329,152 A | 7/1994 | Janai et al. | |
| 5,374,590 A | 12/1994 | Batdorf et al. | |
| 5,400,350 A | 3/1995 | Galvanauskas | |
| 5,451,785 A | 9/1995 | Faris | |
| 5,463,200 A | 10/1995 | James et al. | |
| 5,473,624 A | 12/1995 | Sun | |
| 5,475,527 A | 12/1995 | Hackel et al. | |
| 5,494,781 A | 2/1996 | Ohtani et al. | |
| 5,513,194 A | 4/1996 | Tamura et al. | |
| 5,520,679 A | 5/1996 | Lin | |
| 5,521,628 A | 5/1996 | Montgomery | |
| 5,524,018 A | 6/1996 | Adachi | |
| 5,539,764 A * | 7/1996 | Shields et al. | 372/57 |
| 5,558,789 A | 9/1996 | Singh | |
| 5,569,398 A | 10/1996 | Sun et al. | |
| 5,586,138 A | 12/1996 | Yokogama | |
| 5,592,327 A | 1/1997 | Gabl et al. | |
| 5,627,848 A | 5/1997 | Fermann et al. | |
| 5,632,083 A | 5/1997 | Tada et al. | |
| 5,653,900 A | 8/1997 | Clement et al. | |
| 5,654,998 A | 8/1997 | Turcu et al. | |
| 5,656,186 A | 8/1997 | Mourou et al. | |
| 5,662,822 A | 9/1997 | Tada et al. | |
| 5,669,979 A | 9/1997 | Elliott et al. | |
| 5,685,995 A | 11/1997 | Sun et al. | |
| 5,689,519 A | 11/1997 | Fermann et al. | |
| 5,701,319 A | 12/1997 | Fermann | |
| 5,720,894 A | 2/1998 | Neev et al. | |
| 5,725,914 A | 3/1998 | Opower | |
| 5,739,590 A | 4/1998 | Sakamoto et al. | |
| 5,742,634 A | 4/1998 | Rieger et al. | |
| 5,745,284 A | 4/1998 | Goldberg et al. | |
| 5,751,585 A | 5/1998 | Cutler et al. | |
| 5,759,428 A | 6/1998 | Balamane et al. | |
| 5,786,560 A | 7/1998 | Tatah et al. | |
| 5,790,574 A * | 8/1998 | Rieger et al. | 372/25 |
| 5,811,751 A | 9/1998 | Leong et al. | |
| 5,812,569 A | 9/1998 | Walker et al. | |
| 5,818,630 A | 10/1998 | Fermann et al. | |
| 5,837,962 A | 11/1998 | Overbeck | |
| 5,841,099 A | 11/1998 | Owen et al. | |
| 5,847,960 A | 12/1998 | Cutler et al. | |
| 5,848,080 A | 12/1998 | Dahm | |
| 5,854,805 A | 12/1998 | Reid et al. | |
| 5,864,430 A | 1/1999 | Dickey et al. | |
| 5,867,305 A | 2/1999 | Waarts et al. | |
| 5,880,877 A | 3/1999 | Fermann et al. | |
| 5,920,668 A | 7/1999 | Uehara et al. | |
| 5,923,686 A | 7/1999 | Fermann et al. | |
| 5,925,271 A | 7/1999 | Pollack et al. | |
| 5,940,418 A | 8/1999 | Shields | |
| 5,953,354 A | 9/1999 | Staver et al. | |
| 5,956,354 A | 9/1999 | Yan | |
| 5,974,060 A | 10/1999 | Byren et al. | |
| 5,987,049 A | 11/1999 | Weingarten et al. | |
| 5,998,759 A | 12/1999 | Smart | |
| 6,025,256 A | 2/2000 | Swenson et al. | |
| 6,034,975 A | 3/2000 | Harter et al. | |
| 6,057,180 A | 5/2000 | Sun et al. | |
| 6,072,811 A | 6/2000 | Fermann et al. | |
| 6,099,522 A | 8/2000 | Knopp et al. | |
| 6,103,992 A | 8/2000 | Noddin | |
| 6,144,118 A | 11/2000 | Cahill et al. | |
| 6,148,011 A * | 11/2000 | Larose et al. | 372/6 |
| 6,150,630 A | 11/2000 | Perry | |
| 6,151,338 A | 11/2000 | Grubb et al. | |
| 6,156,030 A | 12/2000 | Neev | |
| 6,169,014 B1 | 1/2001 | McCulloch | |
| 6,172,325 B1 | 1/2001 | Baird et al. | |
| 6,181,728 B1 | 1/2001 | Cordingley et al. | |
| 6,191,486 B1 | 2/2001 | Bernstein | |
| 6,208,458 B1 | 3/2001 | Galvanauskas et al. | |
| 6,210,401 B1 | 4/2001 | Lai | |
| 6,211,485 B1 | 4/2001 | Burgess | |
| 6,239,406 B1 | 5/2001 | Onoma et al. | |
| 6,252,195 B1 | 6/2001 | Mosavi et al. | |
| 6,268,586 B1 | 7/2001 | Stuart et al. | |
| 6,281,471 B1 | 8/2001 | Smart | |
| 6,285,002 B1 | 9/2001 | Ngoi et al. | |
| 6,297,541 B1 | 10/2001 | Ema et al. | |
| 6,300,590 B1 | 10/2001 | Lauer et al. | |
| 6,324,195 B1 | 11/2001 | Suzuki et al. | |
| 6,339,604 B1 | 1/2002 | Smart | |
| 6,340,806 B1 | 1/2002 | Smart et al. | |
| 6,341,029 B1 | 1/2002 | Fillion et al. | |
| RE37,585 E | 3/2002 | Mourou et al. | |
| 6,409,718 B1 * | 6/2002 | Tang | 606/5 |
| 6,421,166 B1 | 7/2002 | Velsko et al. | |
| 6,433,301 B1 | 8/2002 | Dunsky et al. | |
| 6,441,337 B1 | 8/2002 | Isaji et al. | |
| 6,462,306 B1 | 10/2002 | Kitai | |
| 6,472,295 B1 | 10/2002 | Morris et al. | |
| 6,482,199 B1 | 11/2002 | Neev | |
| 6,483,071 B1 | 11/2002 | Hunter et al. | |
| 6,495,791 B2 | 12/2002 | Hunter et al. | |
| 6,501,061 B1 | 12/2002 | Kital et al. | |
| 6,518,540 B1 | 2/2003 | Wee et al. | |
| 6,541,731 B2 | 4/2003 | Mead et al. | |
| 6,552,301 B2 | 4/2003 | Herman et al. | |
| 6,573,473 B2 | 6/2003 | Hunter et al. | |
| 6,574,250 B2 | 6/2003 | Sun et al. | |
| 6,580,055 B2 | 6/2003 | Iso | |
| 6,621,040 B1 | 9/2003 | Perry et al. | |
| 6,639,177 B2 | 10/2003 | Ehrmann et al. | |
| 6,662,063 B2 | 12/2003 | Hunter et al. | |
| 6,664,498 B2 | 12/2003 | Forsman et al. | |
| 6,678,061 B2 | 1/2004 | Kilthau et al. | |
| 6,689,985 B2 | 2/2004 | Lipman et al. | |
| 6,703,582 B2 | 3/2004 | Smart et al. | |
| 6,710,289 B2 | 3/2004 | Iso | |
| 6,717,101 B2 | 4/2004 | Morris et al. | |
| 6,727,458 B2 | 4/2004 | Smart | |
| 6,777,645 B2 | 8/2004 | Ehrmann et al. | |
| 6,849,824 B2 | 2/2005 | Arai | |

| | | |
|---|---|---|
| 6,875,951 B2 | 4/2005 | Sakamoto et al. |
| 6,879,605 B2 * | 4/2005 | Kyusho et al. ................. 372/25 |
| 6,901,090 B1 | 5/2005 | Ohtsuki |
| 6,947,123 B1 | 9/2005 | Ohtsuki |
| 6,951,995 B2 | 10/2005 | Couch |
| 6,972,268 B2 | 12/2005 | Ehrmann et al. |
| 6,989,508 B2 | 1/2006 | Ehrmann et al. |
| 7,015,418 B2 | 3/2006 | Cahill et al. |
| 7,027,155 B2 | 4/2006 | Cordingley et al. |
| 7,050,208 B2 | 5/2006 | Overbeck |
| 7,119,351 B2 | 10/2006 | Woelki |
| 7,126,746 B2 | 10/2006 | Sun et al. |
| 7,148,447 B2 | 12/2006 | Ehrmann et al. |
| 7,176,407 B2 | 2/2007 | Hunter et al. |
| 7,192,846 B2 | 3/2007 | Cordingley et al. |
| 7,358,157 B2 | 4/2008 | Gu et al. |
| 2001/0009250 A1 | 7/2001 | Herman et al. |
| 2001/0022673 A1 | 9/2001 | Sato et al. |
| 2001/0045419 A1 | 11/2001 | Dunsky et al. |
| 2001/0050931 A1 | 12/2001 | Iso |
| 2002/0003130 A1 | 1/2002 | Sun et al. |
| 2002/0005396 A1 | 1/2002 | Baird et al. |
| 2002/0009843 A1 | 1/2002 | Kyusho et al. |
| 2002/0063361 A1 | 5/2002 | Fahey |
| 2002/0131693 A1 | 9/2002 | Islam et al. |
| 2002/0162360 A1 | 11/2002 | Schaffer et al. |
| 2002/0162973 A1 | 11/2002 | Cordingley et al. |
| 2002/0167581 A1 | 11/2002 | Cordingley et al. |
| 2002/0170898 A1 | 11/2002 | Ehrmann et al. |
| 2003/0021324 A1 | 1/2003 | Filgas |
| 2003/0042230 A1 | 3/2003 | Gross et al. |
| 2003/0058440 A1 | 3/2003 | Scott et al. |
| 2003/0151053 A1 | 8/2003 | Sun et al. |
| 2003/0160034 A1 | 8/2003 | Filgas et al. |
| 2003/0161375 A1 | 8/2003 | Filgas et al. |
| 2003/0222324 A1 | 12/2003 | Sun et al. |
| 2004/0057475 A1 | 3/2004 | Frankel et al. |
| 2004/0144760 A1 | 7/2004 | Cahill et al. |
| 2004/0188399 A1 | 9/2004 | Smart |
| 2004/0228004 A1 | 11/2004 | Sercel et al. |
| 2004/0243112 A1 | 12/2004 | Bendett et al. |
| 2005/0041702 A1 | 2/2005 | Fermann et al. |
| 2005/0041976 A1 | 2/2005 | Sun et al. |
| 2005/0067388 A1 | 3/2005 | Sun et al. |
| 2005/0199598 A1 | 9/2005 | Hunter et al. |
| 2005/0215985 A1 | 9/2005 | Mielke et al. |
| 2005/0233537 A1 | 10/2005 | Couch et al. |
| 2005/0279739 A1 | 12/2005 | Bruland et al. |
| 2006/0000814 A1 | 1/2006 | Gu et al. |
| 2006/0028655 A1 | 2/2006 | Cordingley et al. |
| 2006/0086702 A1 | 4/2006 | Smart |
| 2006/0108337 A1 | 5/2006 | Gu et al. |
| 2006/0151704 A1 | 7/2006 | Cordingley |
| 2006/0186096 A1 | 8/2006 | Schramm |
| 2006/0189091 A1 | 8/2006 | Gu |
| 2006/0191884 A1 | 8/2006 | Johnson et al. |
| 2006/0192845 A1 | 8/2006 | Cordingley et al. |
| 2006/0199354 A1 | 9/2006 | Gu |
| 2006/0205121 A1 | 9/2006 | Couch et al. |
| 2006/0207975 A1 | 9/2006 | Ehrmann et al. |
| 2006/0216927 A1 | 9/2006 | Cordingley et al. |
| 2006/0256181 A1 | 11/2006 | Ehrmann et al. |
| 2007/0031993 A1 | 2/2007 | Nemets et al. |
| 2007/0052791 A1 | 3/2007 | Cordingley et al. |
| 2007/0053391 A1 | 3/2007 | Oron et al. |
| 2007/0075058 A1 | 4/2007 | Ehrmann et al. |
| 2007/0106416 A1 | 5/2007 | Griffiths et al. |
| 2007/0117227 A1 | 5/2007 | Gu |
| 2007/0173075 A1 | 7/2007 | Lee et al. |
| 2007/0178714 A1 | 8/2007 | Gu et al. |
| 2007/0215575 A1 | 9/2007 | Gu et al. |
| 2007/0215820 A1 | 9/2007 | Cordingley et al. |
| 2008/0011852 A1 | 1/2008 | Gu et al. |
| 2008/0035614 A1 | 2/2008 | Smart |
| 2008/0067155 A1 | 3/2008 | Gu |
| 2008/0073438 A1 | 3/2008 | Gu et al. |
| 2008/0094640 A1 | 4/2008 | Cordingley et al. |

FOREIGN PATENT DOCUMENTS

| | | |
|---|---|---|
| EP | 0 902 474 A2 | 3/1999 |
| GB | 2 331 038 | 5/1999 |
| JP | 53-152662 | 6/1980 |
| JP | 55-081095 | 6/1980 |
| JP | 56-143434 | 11/1981 |
| JP | 62-086839 | 4/1987 |
| JP | 63-136545 | 6/1988 |
| JP | 63-264286 | 11/1988 |
| JP | 63-302503 | 12/1988 |
| JP | 64-044295 | 2/1989 |
| JP | 02-089586 | 11/1989 |
| JP | 01-289586 | 3/1990 |
| JP | 02-063103 | 3/1990 |
| JP | 03-297588 | 12/1991 |
| JP | 04-006599 | 1/1992 |
| JP | 04-098801 | 3/1992 |
| JP | 05-235169 | 9/1993 |
| JP | 06-142968 | 5/1994 |
| JP | 2531453 | 6/1996 |
| JP | 63-005891 | 1/1998 |
| JP | 02003133690 | 5/2003 |
| WO | WO 96/16484 | 5/1996 |
| WO | WO 98/53949 | 3/1998 |
| WO | WO 98/28104 | 7/1998 |
| WO | WO 98/31049 | 7/1998 |
| WO | WO 98/42050 | 9/1998 |
| WO | WO 98/42050 A1 | 9/1998 |
| WO | WO 01/87534 A2 | 11/2001 |
| WO | WO 03/047807 A1 | 6/2003 |
| WO | WO 03/052890 | 6/2003 |
| WO | WO 03/052890 A1 | 6/2003 |

OTHER PUBLICATIONS

Application and Figures of patent application, filed Oct. 10, 2003.
Bado, Philippe, Ulrafast Lasers Escape the Lab, Photonics Spectra, Jul. 1998, pp. 157-161.
Bechtel, James, et al., Laser Applications, vol. 5, pp. 1-18 & 64-67.
Bernstein, Joseph B., et al., Metal Wire Cutting by Repeated Application of Low-Power Laser Pulses, Massachusetts, Feb. 17, 1992, pp. 1-3.
Bernstein, Joseph, B., et al., Laser Energy Limitation for Buried Metal Cuts, IEEE Electron Device Letters, vol. 19, No. 1 Jan. 1998, pp. 4-6.
Bernstein, Joseph, et al., Analysis of Laser Metal Cut Energy Process Window, IEEE Trans. On Semicond. Manufact., vol. 13, No. 2, May 2000, pp. 228-234.
Bloembergen, N., From nanosecond to femtosecond science, Rev. Mod. Phys., pp. S283-S287, vol. 71, No. 2, Centenary 1999, The American Physical Society.
Boogard, Jerry, Precision Laser Micromachining, SPIE, vol. 611, Portlan, Oregon, 1986, pp. 48-59.
Bostanjoglo, R. et al., Ablation of metal film by picosecond laser pulses imaged with high-speed electron microscopy, J. Appl. Phys. 76(5), Sep. 1, 1994, pp. 3045-3048.
Brisbane, A.D., et al., Electric Comp. 1968, p. 146.
Burnt Into a Memory, Electrons, vol. 41, No. 26, Dec. 23, 1968, pp. 37.
Cacouris, Ted., Preventing Cross-Contamination Caused by Copper Diffusion and Other Sources, Micro, Jul./Aug. 1999, pp. 43-52.
Chichkov et al., "Femtosecond, Picosecond, and Nanosecond Laser Ablation of Solids", Applied Physics, A 63, 109-115, 1996.
Cohen, Simon, et al., Laser Beam Processing and Wafer Scale Integration, 1988, pp. 85-111.
Corkum, P.B., et al., Thermal Response of Metals to Ultrashort-Pulse Laser Excitation, The American Physical Society, Dec. 19, 1988, vol. 61, No. 25, pp. 2886-2889.
Damascus, Novellus, Benefits of Copper—Copper Technology is Here Today in Working Devices, Dec. 20, 2001.
Du, D., et al., Laser-induced breakdown by impact ionization in $SiO_2$ with pulse widths from 7 mns to 150fs, pp. 3071-3073, Appl. Phys. Lett. 64 (23), Jun. 6, 1994, Ameican Institute of Physics.
Elliott, David, Ultraviolet Laser Technology and Application, Wayland, MA, 1995, pp. 137-141.

ESI '347 Claim Chart, pp. 1-92.
ESI '498 Claim Chart, pp. 1-96.
Fauchet P.M., et al., Surface Ripples on Silicon and Gallium Arsenide Under Picosecond Laser Illuminatio, Applied Physics Lett. 40(9), May 1, 1982, pp. 824-826, Stanford, California.
Fluck, R., et al., Passively Q-switched 1.34-um Nd:YVO, Microchip Laser with Semiconductor Saturable-Absorber Mirrors, Optics Letters, vol. 22, No. 13, Jul. 1, 1997, pp. 991-993, Zurich, Switzerland.
Gitin, Mark, UV Lasers: State of The Art Is All-Solid-State, Photonics Spectra, Sep. 1998, pp. 136-139.
Gotz, T., et al., Short-pulsse UV laser ablation of solid and liquid metals: indium pp. 539-543, Appl. Phys. A 64, 539-543 (1977), Springer-Verlag.
Gu, Jianhui, et al., Passive Q-Switching of a NdYAG Lasr With a GaAs Output Coupler, Opt. Eng. 38(11), Nov. 1999, pp. 1785-1788.
Guide for Material Processing by Lasers, Laser Institute of America, The Paul M. Harrod Company, Baltimore, MD, 1977, pp. 5-1 to 5-13.
Haight, Richard, et al., Implementation and Performance of a Femtosecond Laser Mask Repair System in Manufacturing, Presentation of 1998 SPIE BACUS Meeting, pp. 1-8.
Haneman, D., et al., Surface Topography of Laser Annealed Silicon, Solid State Communications, vol. 43, No. 3, pp. 203-206, 1982, Great Britain.
Herman, "Laser Micromachining of Transparent Glasses and Aluminum With ps-pulse Bursts at 1054 nm", CLEO 2000, CDF3 (2000).
Hoogland S., et al., Passively Mode-Locked Diode-pumped Surface-Emitting Semiconductor Laser, IEEE Photonics Technology Letters, vol. 12, No. 9, Sep. 2000, pp. 1135-1137.
International Search Report and Written Opinion dated Jul. 3, 2008 for PCT/US07/61592, filed Feb. 5, 2007.
Ippen, E.P., et al., Picosecond Pulse Generation by Passive Mode Locking of Diode Lasers, Applied Physics Lett 37 (3), Aug. 1, 1980, pp. 267-269.
Jandeleit, J., et al., Picosecond laser ablation of thin copper films, Appl. Phys. A 63, 117-121 (1996) Springer-Verlag.
Kautek, W., et al., Femtosecond-Pulse Laser Microstructuring of Semiconducting Materials, Materials Science Forum, vols. 173-174, 1995, pp. 17-22, Berlin, Germany.
Keirstead, Mark, et al., UV Lasers Are Workhorses k, Laser Focus World, SPL/Intergen, Jun. 2001, pp. 1-3.
Keller, Ursula, et al., Semiconductor Saturable Absorber Mirrors (SESAM'S) for Femtosecond to Nanosecond Pulse Generation in Solid-State Lasers, Journal of Selected Topics in Quantum Electronics, vol. 2, No. 3, Sep. 1996, pp. 435-453.
Keller, Ursula, Recent Developments in Compact Ultrafast Lasers, Nature vol. 424, Aug. 14, 2003, pp. 831-838.
Kikawa, Takarnaro, Quarter-Micron Interconnection Technologies for 256M DRAMs, Extended Abstracts, Int. Conf. Solid Devices and Materials, 1992, pp. 90-92.
Kruger, Jorg, et al., Femtosecond-Pulse Laser Processing of Metallic and Semiconducting Thin Films, SPIE, vol. 2403, pp. 436-447.
Kruger, Jorg, et al., Laser-Induced Thin Film Processing, Femtosecond-Pulse Laser Processing Metallick and Semiconducting Thin Films, Applied Physics A 63, Materials Science & Processing, 1996, 434/SPIE vol. 2403-SPIE vol. 2403/447, pp. 117-121.
Kyusho, Yukio, et al., High-Energy Subnanosecond Compact Laser System with Diode-Pumped, Q-Switched Nd: YVO, Laser, OSA TOPS on Advanced Solid-State Lasers, 1996, vol. 1, pp. 382-385.
Lapezyna, M., et al., Ultra High Repetition Rate (133 MHZ) Laser Ablation of Aluminum with 1.2-ps. Pulses, Applied Physics A, Materials Science & Processing, 1999, pp. S883-S886.
Lee, J., et al., Analysis of Energy Process Window of Laser Metal Pad Cut Link Structure, IEEE Semiconduc. Manufact., vol. 16, No. 2, May 2003, pp. 299-306.
Lee, J., et al., Analysis of Laser Metal Cut Energy Process Window and Improvement of Cu Link Process by Unique Fast Rise Time Laser Pulse, Proceedings of Semiconductor Manufacturing Technology Workshop, Hsinchu, Taiwan, Dec. 2002, pp. 171-174.
Lee, J., et al., Analyzing the Process Window for Laser Copper-Link Processing, Solid State Technology, Dec. 2002, pp. 63-65.
Lenzner, M., et al. Precision laser ablation of dielectrics in the 10-fs regime: Appl. Phys. A. 68, 369-371 (1999).

"Link Cutting/Making", Handbook of Laser Materials Processing, Chapter 19, pp. 595-615, Laser Institute of America (2001).
Litwin and Smart, "Laser Adjustment of Linear Monolithic Circuits", ICAELO (1983).
Liu, Hsiao-Hua, et al., Effects of Wavelength and Doping Concentration on Silicon Damage Threshold, pp. 1-2.
Liu, Xinbing, et al., Ultrashort laser pulses tackle precision machining, Laser Focus World, Aug. 1977, pp. 101-118.
Marine, W., et al., Picosecond YAG Laser Photoablation of Amorphous Silicon, Applied Surface Science 46, 1990, pp. 239-244, France.
Marine, W., Laser induced plasma formation by picosecond pulse irradiation, Applied Surface Science 69 (1993) 290-298 North-Holland, Elsevier Science Publishers B.V.
Marjoribanks, R.S., et al., High-Contrast Terawatt Chirped-Pulse-Amplification Laser That Uses A 1-ps N-d:glass Oscillator, Optics Letters, Mar. 1, 1993, vol. 18, No. 5, pp. 361-363.
Martin, P., et al., Electron and ion emission in high-intensity laser irradiation of aluminum, Physical Review B, pp. 69-77, vol. 45, No. 1 Jan. 1992-I, 1992 The American Physical Society.
Mitani, Masao, et al., Laser Cutting of Aluminum Thin Film With No Damage to Under-Layers, Annals of the Cirp., vol. 28, No. 1, 1979, pp. 113-116.
Muller, Heinrich G., et al., Laser Process for Personalization and Repair of Multi-Chip-Modules, Lasers in Microelectric Manufacturing, 1991, pp. 132/SPIE vol. 1598 140/SPIE vol. 1598.
Ngoi, Bryan K. A., et al., Submicron micromachingin on silicon wafer using femtosecond pulse laser, J. Laser Appl., vol. 13m No. 1, Feb. 2001, Laser Institute of America.
Nolte, S., et al., Ablation of Metals by Ultrashort Laser Pulses, J. Optical Society Am. B, vol. 14., No. 10, Oct. 1997, pp. 2716-2722, Hannover, Germany.
North, J.C., Laser Vaporization of Metal Films—Effect of Optical Interference in Underlying Dielectric Layers, Journal of Applied Physics, vol. 48, No. 6, Jun. 1977.
North, James C., et al., Laser Coding of Bipolar Read-Only Memories, IEEE Journal of Solid State Circuits, vol. SC-41, No. 4, Aug. 1976, pp. 500-505.
Optoelectronics World, Supplement to Laser Focus World, Micromachining: the growth engine for industrial lasers, Jun. 2001, (composed of 6 separate articles), Industrial Laser Solutions.
Paschotta, R., et al. Passive Mode Locking with Slow Saturable Absorbers, Applied Physics B 73, Lasers and Optics, pp. 653-662, Zurich, Switzerland.
Pasmanik, *Pico vs Femto in Micromachining*, Laser Focus (Toronto), Optoelectronics World, Jun. 2001, pp. 221, 222 & 224.
Patel, R.S., et al., Via Production Benefits From Excimer-Laser Tools, Laser Focus World, Jan. 1996, pp. 71-75.
Perry, M.D., et al., Ultrafast Laser for Materials Processing, LIA Handbook of Laser Materials Processing, Laser Institute of America, Magnolia Publishing, Inc., 2001, Chapter 2, pp. 82 and Chapter 13, pp. 499-508.
Pronko, P.P. et al., Thermophysical effects in Laser Processing of Materials with Picosecond and Femtosecond Pulses, J. Appl. Phys. 78 (10) Nov. 15, 1995, pp. 6233-6240.
Raevsky, Eugene, V., et al., Stabilizing the Output of a Pockels Cell Q-Switched NdYAG Laser, Opt. Eng. 38 (11), Nov. 1999, pp. 1781-1784.
Ready, John F., Effects of High-Power Laser Radiation, Academic Press, New York, 1971, pp. 115-116.
Ready, John F., et al., Ultrashort-Pulse Laser Machining, LIA Handbook of Laser Materials Processing, Chapter 13, Hole Drilling, pp. 499-508.
Ready, John F., LIA Handbook of Laser Materials Processing, Chapter 1: Overview of Laser Materials Processing, 2001, pp. 7-9.
Ready, John F., LIA Handbook of Laser Materials Processing, Ultrafast Lasers for Materials Processing, 2001, pp. 82.
Remarks/Arguments sent to the Patent Office on Dec. 28, 2006 in Response to the Office Action dated Jun. 30, 2006 of U.S. Appl. No. 10/818,920, pp. 41-124.
Rubenchik, A.M., Numerical simulation of ultra-short laser pulse energy deposition and bulk transport for material processing, Applied Surface Science 127-129 (1988) 193-198.

Scarfone, L.M., et al., Computer Simulation of Target Link Explosino in Laser Programmable Redundancy for Silicon Memory, K. Mater. Res. 1 (2), Mar./Apr. 1986.

Shank, C.V., et al., Time-Resolved Reflectivity Measurments of Femtosecond-Optical-Pulse=Induced Phase Transitions in Silicon, Physical Review Letters, vol. 50, No. 6, Feb. 7, 1983, Holmdel, New Jersey, pp. 454-457.

Simon, P., et al., Ablation of submicron structures on metals and semiconductors by femtosecond UV-laser pulses, Applied Surface Science 109-110 (1997) 25-29.

Simon, P., et al., Machining of submicron structures on metals and semiconductors by ultrashort UV-laser pulses, Appl. Phys. A 63, 505-508 (1996).

Smart, Don, Optimization of Semiconductor Layer Thickness for Repair of RAMs, Application Report 150, Teradyne, pp. 1-9.

Smart, Donald V., Lind Processing with Lasers, 1998, pp. 1-20.

Smart, Donald, et al., Laser Processing for Application Specification Integrated Circuits (ASICS), SPIE, vol. 774, 1987, pp. 88-92.

Spuhler, G.J., et al., Output-Coupling Semiconductor Saturable Absorber Mirror, Applied Physics Letters, vol. 78, No. 18, Apr. 30, 2001,pp. 2733-2735.

Srivatsa, Arun R., et al., Measurement of Advanced Low K Materials.

Stuart, B.C., et al., Optical Ablation by High-Power Short-Pulse Lasers, J. Optical Society, vol. 13, No. 2, Feb. 1996, pp. 459-468, Livermore, California.

Stuart, B.C., et al., Ultrashort-pulse optical damage, 616-629 SPIE vol. 2714.

Stuart, B.C., et al., Ultrashort-Pulse Optical Damage, SPIE, vol. 2714, pp. 616-628, Livermore, California.

Subrahmanyan, Pradeep K., Laser Micromachining in the Microelectronics Industry: Emerging Applications.

Sun, et al., Optimization of Memory Redundancy Link Processing, vol. SPIE 2636, 1995.

Sun, Yunlong, Interference Effect on Laser Trimming and Layer Thickness Optimization, SPIE vol. 1598, 1991.

Taterson, Kathleen G., Fiber Laser Sets A Record, Photonics Spectra, Murray Hill, New Jersey, Aug. 1997, pp. 32.

Von Der Linde, D., et al., Breakdown threshold and plasma formation in femtosecond laser-solid interaction, J. Opt. Soc. Am. B/vol. 13, pp. 216-222, No. 1/Jan. 1996.

Von Der Linde, D., et al., Breakdown Threshold and Plasma Formation in Femtosecond Laser-Solid Interaction, J. Opt. Soc. Am B/vol. 13 No. 1 Jan. 1996.

Washio, K., Laser Applications in Electronics and Optoelectronics Industry in Japan, Part of the SPIE Conference on Laser Applns. In Microelcetronic and Optoelectronic Manufacturing IV, San Jose, CA, Jan. 1999, SPIE vol. 3618, pp. 230-239.

Washio, K., Laser Processing: Principles and Advanced Applications—Part 2, International Symposium on Microelectronics and Assembly, (ISMA '97 Educational Short Courses),pp. 1-101.

Water, "Xenon Laser Repairs Liquid Crystal Displays", Laser and Optronics, Apr. 1988, pp. 39-41, Vo.. 7, No. 4.

Waters, Xenon Laser Repairs Liquid-Crystal Displays, Lasers & Optronics, Apr. 1988, pp. 39-41.

Zayhowski, Q-Switched Microchip Lasers Find Real World Application, Laser Focus World, Aug. 1999, pp. 129-136.

Zhang, W., et al., Modeling and Analysis of UV Laser Micromachining of Copper, Int J Adv Manuf Technol (2001) 18: 323-331, Springer-Verlag London Limited.

Zhang, Zhuhong, et al., Gallium Arsenide: A New Material to Accomplish Passively Mode-Locked Nd:YAG Laser, Applied Physics Lett. vol. 60, No. 4, Jan. 27, 1992, pp. 419-421, Shanghai, PRC.

Zhao, J.-X., et al., Micromachining with Ultrashort Laser Pulses, pp. 114-121, SPIE vol. 3618.

Zhu et al., "Influence of Laser Parameteres and Material Properties on Mirco-Drilling with Femtosecond Laser Pulses", Appl. Phy. A 67 (Suppl.) 5367-5371 (1999) Integrated Circuits (ASICS), SPIE, vol. 774, 1987, pp. 88-92 (Sec. 367-371).

Zhu, X., On Ultrashort Laser Pulse Machining, Report, No. 2, 1998, pp. 1-8.

Zhu, Ziaonong, On Ultrashort Laser Pulse Machining, Optoelectronics World, Jun. 2001, pp. 1-16.

\* cited by examiner

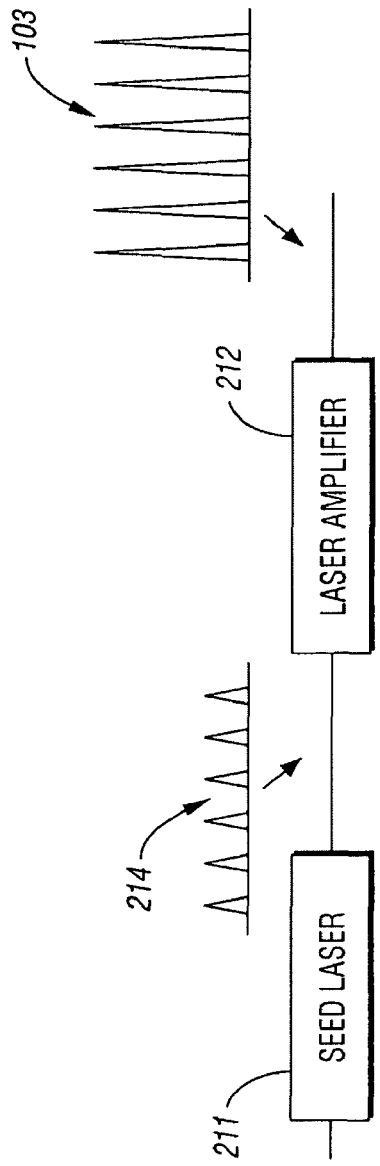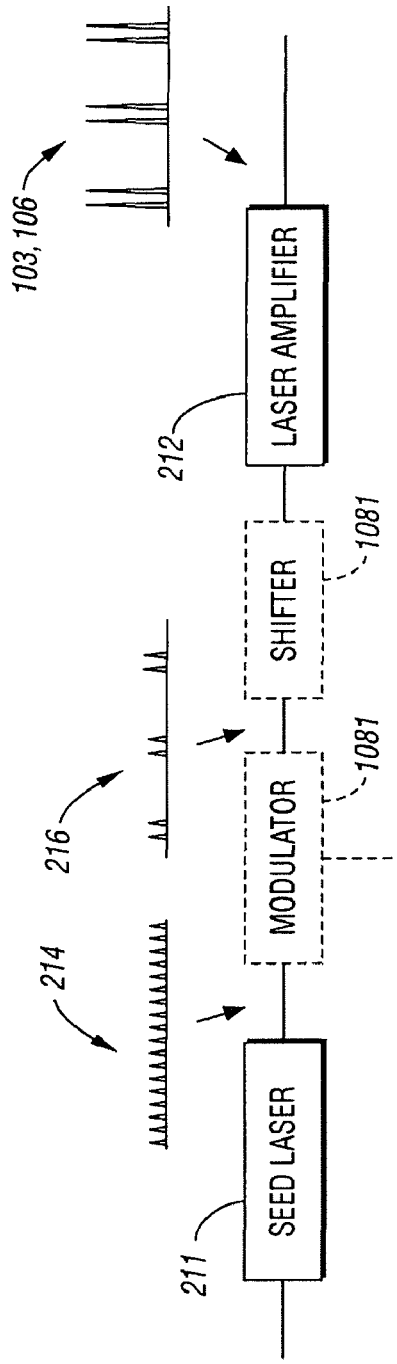

LASER-BASED METHOD AND SYSTEM FOR REMOVING ONE OR MORE TARGET LINK STRUCTURES

CROSS-REFERENCE TO RELATED APPLICATIONS

This application is a continuation of U.S. patent application Ser. No. 11/700,386, filed on Jan. 31, 2007, now U.S. Pat. No. 7,838,794 which application claims the benefit of U.S. Provisional Ser. No. 60/765,401, filed Feb. 3, 2006, and which application is a continuation-in-part application to U.S. Ser. No. 10/683,086, filed Oct. 10, 2003, now U.S. Pat. No. 7,723,642, which, in turn, is a continuation-in-part of U.S. Ser. No. 09/941,389, filed Aug. 28, 2001, now U.S. Pat. No. 6,727,458 entitled "Energy-Efficient, Laser Based Method and System for Processing Target Material," which is a continuation of U.S. Ser. No. 09/473,926, filed Dec. 28, 1999, now U.S. Pat. No. 6,281,471. This application is also a continuation-in-part of U.S. Ser. No. 10/107,890 entitled "Methods and Systems for Thermal-Based Laser Processing a Multi-Material Device," filed Mar. 27, 2002, published as 2002/0167581, which claims the benefit of U.S. Provisional Application Ser. No. 60/279,644, filed Mar. 29, 2001. The disclosures of all the above mentioned patents, publications, and applications are hereby incorporated by reference in their entireties.

BACKGROUND OF THE INVENTION

1. Field of the Invention

The present invention relates to the field of laser processing methods and systems, and specifically to laser processing methods and systems for removing one or more conductive target link structures formed on substrates. This invention is particularly applicable, but not limited to, laser repair of redundant semiconductor memory devices.

2. Description of the Related Art

Economics and device performance have driven the size for the DRAMs and logic devices to very small physical dimensions. Not only are the devices small, but the interconnects and links thickness have also decreased dramatically in recent years.

Some thermal laser processing of links, for example, as described in "Link Cutting/Making" in HANDBOOK OF LASER MATERIALS PROCESSING, Chapter 19, pp. 595-615, Laser Institute of America (2001), relies on the differential thermal expansion between the oxide above the link and the link itself. The differential expansion results in a high pressure build-up of the molten link contained by the oxide. The oxide over the link is necessary to contain the link in a molten state long enough to build-up sufficient pressure to crack the oxide and explosively expel the link material. If the pressure is too low, the link will not be removed cleanly. Alternative laser wavelengths and laser control strive to increase the laser "energy window" without damaging the substrate and material contiguous to the link.

Further information is available regarding link blowing methods and systems, including material processing, system design, and device design considerations, in the following representative U.S. patents and published U.S. applications: U.S. Pat. Nos. 4,399,345; 4,532,402; 4,826,785; 4,935,801; 5,059,764; 5,208,437; 5,265,114; 5,473,624; 6,057,180; 6,172,325; 6,191,486; 6,239,406; 2002-0003130; and 2002-0005396.

Other representative publications providing background on link processing of memory circuits or similar laser processing applications include: "Laser Adjustment of Linear Monolithic Circuits," Litwin and Smart, ICAELO, (1983); "Computer Simulation of Target Link Explosion In Laser Programmable Memory," Scarfone, Chlipala (1986); "Precision Laser Micromachining," Boogard, SPIE Vol. 611 (1986); "Laser Processing for Application Specific Integrated Circuits (ASICS)," SPIE Vol. 774, Smart (1987); "Xenon Laser Repairs Liquid Crystal Displays," Waters, Laser and Optronics, (1988); "Laser Beam Processing and Wafer Scale Integration," Cohen (1988); "Optimization of Memory Redundancy Link Processing," Sun, Harris, Swenson, Hutchens, Vol. SPIE 2636, (1995); "Analysis of Laser Metal Cut Energy Process Window," Bernstein, Lee, Yang, Dahmas, IEEE Trans. On Semicond. Manufact., Vol. 13, No. 2. (2000); "Link Cutting/Making" in HANDBOOK OF LASER MATERIALS PROCESSING, Chapter 19, pp. 595-615, Laser Institute of America (2001).

Requirements for the next generation of dynamic random access memory (DRAM) include fine pitch links having link widths less than 0.5 microns and link pitch (center to center spacing) less than 2 microns (e.g., 1.33 microns). Current commercial laser memory link repair systems, which use q-switched, Nd based solid-state lasers with wavelengths of about 1 to 1.3 microns and pulse widths about 4 to 50 nanoseconds (ns), are not well suited for meeting such requirements. The large (wavelength limited) spot size and thermal effect (pulse width limited) are two limiting factors.

In INTERNATIONAL JOURNAL OF ADVANCED MANUFACTURING TECHNOLOGY (2001) 18:323-331, results of copper laser processing are disclosed. A frequency tripled Nd:YAG laser with 50 nanosecond (ns) pulse duration was used. The measured heat affected zones (HAZ) were about 1 micron for $6 \times 10^8$ W/cm$^2$ irradiance and more than 3 microns for about $2.5 \times 10^9$ W/cm$^2$ irradiance.

Attempts have been made to address the problems. Reference is made to the following U.S. patents and published applications: U.S. Pat. Nos. 5,208,437; 5,656,186; 5,998,759; 6,057,180, 6,300,590; 6,574,250; WO 03/052890; and European patent EP 0902474. In summary, the conventional q-switched, nanosecond solid-state lasers, even at short wavelengths, are not able to process the fine pitch links due to its thermal process nature. Material interaction may be a substantially non-thermal process at femtosecond pulse widths, but the complexity, high costs, and reliability of femtosecond pulse lasers may limit practical implementations. Device and material modifications to support laser repair are expensive and alone may not be sufficient. An improved method and system for fine pitch link processing is needed to circumvent problems associated with thermal effects yet provide for efficient link removal at high repetition rates without the complexity associated with femtosecond laser systems.

The following references [1]-[12] are also related to the present invention, some of which are referenced herein:

[1] J. Lee, J. Ehrmann, D. Smart, J. Griffiths and J. Bernstein "Analyzing the process window for laser copper-link processing," *Solid State Technology*, pp. 63-66, December 2002.

[2] J. B. Bernstein, J. Lee, G. Yang and T. Dahmas, "Analysis of laser metal-cut energy process window," *IEEE Semiconduct. Manufact., Vol.* 13, No. 2, pp. 228-234, 2000.

[3] J. Lee and J. B. Bernstein, "Analysis of energy process window of laser metal pad cut link structure," *IEEE Semiconduct. Manufact.*, Vol. 16, No. 2, pp. 299-306, May 2003.

[4] J. Lee and J. Griffiths, "Analysis of laser metal cut energy process window and improvement of Cu link process by unique fast rise time laser pulse," *Proceedings of Semicon-* ductor Manufacturing Technology Workshop, Hsinchu, Taiwan, pp. 171-174, December 2002.

[5] T. Kikkawa, "Quarter-micron interconnection technologies for 256M Drams," Extended Abstracts, *Int. Conf. Solid Devices and Materials*, pp. 90-92, 1992.

[6] M. D. Perry, B. C. Stuart, P. S. Banks. M. D. Feit and J. A. Sefcik, "Ultrafast Laser for Materials Processing," p. 82 and pp. 499-508, *LIA Handbook of Laser Materials Processing*, Laser Institute of America, Magnolia Publishing, Inc., 2001.

[7] H. Liu, G. Mourou, Y. N. Picard, S. M. Yalisove and T. Juhasz, "Effects of Wavelength and Doping Concentration on Silicon Damage Threshold," *Laser and Electro-Optics*, Vol. 2, p. 2, May 2004.

[8] G. Pasmanik, "Pico versus Femto in Micromachining," *Optoelectronics World*, pp. 221-224, June 2001.

[9] J. Jandeleit, G. Urbasch, H. D. Hoffmann, H. G. Treusch and E. W. Kreutz, "Picosecond Laser Ablation of Thin Copper Films," *Appl. Phys.*, Vol. A 63, pp. 117-121, 1996.

[10] J. C. North and W. W. Weick, "Laser Coding of Bipolar Read-Only Memories," *IEEE Journal of Solid State Circuits*, Vol. SC-11, No. 4, pp. 500-505, 1976.

[11] J. B. Bernstein, S. S. Cohen and P. W. Wyatt, "Metal Wire Cutting by Repeated Application of Low-Power Laser Pulses," *Rev. Sci. Instrum.*, 63(6), pp. 3516-3518, 1992.

[12] M. Lapczyna, K. P. Chen, P. R. Herman, H. W. Tan and R. S. Marjoribanks, "Ultra high repetition rate (133 MHz) laser ablation of aluminum with 1.2-ps pulses," *Appl. Phys.*, Vol. A 69 [Suppl.], S883-S886, 1999.

SUMMARY OF THE INVENTION

An object of at least one embodiment of the present invention is to provide a method and system for improving the quality of laser processing (i.e., removal, ablation, severing, "blowing," etc.) memory links.

Another object of at least one embodiment of the present invention is to provide a method and system for laser processing fine pitch memory links.

In carrying out the above objects and other objects of the present invention, a laser-based method of removing a target link structure of a circuit fabricated on a substrate without causing undesirable damage to the substrate, any dielectric layers between the target link structure and the substrate, or link structures adjacent the target link structure is provided. The target link structure is in a set of link structures. At least some link structures in the set of link structures are separated by a pitch of less than 2 μm. The method includes generating a sequence of laser pulses at a repetition rate of greater than about 1 MHz utilizing a seed laser having a first predetermined wavelength. The method further includes optically amplifying at least a portion of the sequence of laser pulses to obtain an amplified sequence of output pulses. The method still further includes delivering and focusing pulses of the amplified sequence of output pulses onto the target link structure during relative motion of the substrate. Substantially all output pulses of the amplified sequence of output pulses have a pulse duration less than about 100 picoseconds, corresponding pulse power densities in the range of at least about $10^9$ $W/cm^2$ to less than about $10^{12}$ $W/cm^2$ at the target link structure, and a wavelength of about 1.2 microns or less. The power density of the focused pulses is low enough to avoid the undesirable damage. The total energy of all of the focused pulses is high enough to remove the target link structure while also avoiding the undesirable damage to other link structures in the set of link structures. The focused pulses provide for a relative energy process window of 30% or greater for link pitches in a range of about 1 micron to about 2 microns.

The step of generating may include a step of pre-amplifying output of the seed laser to a pulse energy level prior to the step of optically amplifying.

The method may further include shifting the first predetermined wavelength to a second wavelength prior to the step of optically amplifying.

The method may further include controllably selecting, subsequent to the step of optically amplifying, at least a portion of the amplified sequence of output pulses based on at least one of position and velocity information to synchronize the target link structure and laser beam position during the relative motion.

The method may further include controllably selecting, prior to the step of optically amplifying, at least a portion of the sequence of laser pulses based on at least one of position and velocity information to synchronize the target link structure and laser beam position during the relative motion.

The step of generating may include gain switching the seed laser to provide a pulse on demand.

Temporal spacing between substantially all immediately adjacent pulses of the sequence of laser pulses may be at least 5 nanoseconds. The step of controllably selecting may reduce the repetition rate to within a range of about 20 KHz to 150 KHz.

The sequence of laser pulses may include at least one pulse having a pulse duration greater than about 1 nanosecond. The method may further include compressing or slicing the at least one pulse to produce a pulse having a pulse duration less than about 100 ps.

The seed laser may be a q-switched microlaser or laser diode having a pulse duration of about one nanosecond.

The step of compressing or slicing may be performed prior to the step of optically amplifying.

The seed laser may be a diode-pumped, solid-state laser.

The diode-pumped, solid-state laser may be a fiber laser oscillator.

The seed laser may be an active or passive mode-locked laser.

The seed laser may be a high-speed, semiconductor laser diode.

The step of optically amplifying may be performed by at least one fiber-optic amplifier.

The fiber-optic amplifier may have a gain of about 30 dB.

The first predetermined wavelength may be in a range of about 1.3 μm to about 1.55 μm and may further include shifting laser wavelength of the amplified sequence of output pulses from the first predetermined wavelength to a near infrared or visible wavelength.

The step of generating may be carried out with a master oscillator and power amplifier (MOPA).

The number of output pulses and speed of the relative motion may cause a displacement of the output pulses to exceed a predetermined tolerance. The method may further include deflecting the output pulses to direct the output pulses to locations within the predetermined tolerance.

Still further in carrying out the above objects and other objects of the present invention, a laser-based system for removing a target link structure of a circuit fabricated on a substrate without causing undesirable damage to the substrate, any dielectric layers between the target link structure and the substrate, or link structures adjacent the target link structure is provided. The target link structure is in a set of link structures. At least some link structures in the set of link structures are separated by a pitch of less than 2 μm. The system includes means including a seed laser for generating a sequence of laser pulses at a repetition rate of greater than about 1 MHz, the seed laser having a first predetermined wavelength. The system further includes means for optically amplifying at least a portion of the sequence of laser pulses to obtain an amplified sequence of output pulses. The system still further includes means for delivering and focusing pulses of the amplified sequence of output pulses onto the target link structure during motion of the substrate relative to the link structure. Substantially all pulses of the amplified sequence of output pulses have a pulse duration less than about 100 picoseconds, corresponding pulse power densities in the range of at least about $10^9$ W/cm$^2$ to less than about $10^{12}$ W/cm$^2$ at the target link structure, and a wavelength of about 1.2 microns or less. The power density of the focused pulses is low enough to avoid the undesirable damage. The total energy of all of the focused pulses is high enough to remove the target link structure while also avoiding the undesirable damage to other link structures in the set of link structures. The focused pulses provide for a relative energy process window of 30% or greater for link pitches in a range of about 1 micron to about 2 microns.

The means for generating may include a master oscillator and power amplifier (MOPA).

The system may further include means for controllably selecting at least a portion of the amplified sequence of output pulses based on at least one of position and velocity information to synchronize the target link structure and laser beam position during the relative motion. The means for controllably selecting may include either an acousto-optic modulator or an electro-optic modulator.

Temporal spacing between substantially all immediately adjacent pulses of the sequence of laser pulses may be at least 5 nanoseconds. The means for controllably selecting may reduce the repetition rate to within a range of about 20 KHz to 150 KHz.

The modulator may be a Mach-Zehnder modulator.

The sequence of laser pulses may include at least one pulse having a pulse duration greater than about 1 nanosecond. The system may further include a compressor or pulse slicer to compress or slice, respectively, the at least one nanosecond pulse to produce a pulse having a pulse duration less than about 100 ps.

The seed laser may be a q-switched microlaser or laser diode having a pulse duration of about one nanosecond.

An output of the compressor or slicer may be received by the means for optically amplifying.

The seed laser may be a diode-pumped, solid-state laser.

The diode-pumped, solid-state laser may be a fiber laser oscillator.

The seed laser may be an active or passive mode-locked laser.

The seed laser may be a high-speed, semiconductor laser diode.

The means for optically amplifying may include at least one fiber-optic amplifier.

The fiber-optic amplifier may have a gain of about 30 dB.

The first predetermined wavelength may be in a range of about 1.3 μm to about 1.55 μm, and may further include a wavelength shifter to shift the laser wavelength of the amplified sequence of output pulses from the first predetermined wavelength to a near infrared or visible wavelength.

The means for generating may include a master oscillator and the means for optically amplifying may include a power amplifier (MOPA).

The number of output pulses and speed of relative motion may cause a displacement of the output pulses to exceed a predetermined tolerance. The system may further include a high-speed beam deflector to direct the output pulses to locations within the tolerance.

Yet still further in carrying out the above objects and other objects of the present invention, a method of removing a selected target link structure of a circuit fabricated on a substrate without causing undesirable damage to the substrate, any dielectric layers between the selected target link structure and the substrate, or link structures adjacent the selected target link structure is provided. The selected target link structure is in a set of link structures. At least some link structures in the set of link structures are separated by a pitch of less than 2 μm. The method includes applying a focused laser output to the selected target link structure to remove the selected target link structure during motion of the substrate relative to the laser output. The laser output has at least about 70 pulses. Substantially all of the pulses have a pulse width less than about 100 picoseconds and corresponding pulse power densities in the range of at least about $10^9$ W/cm$^2$ to less than about $10^{12}$ W/cm$^2$ at the selected target link structure, and a wavelength of about 1.2 microns or less. The power density of the pulses is low enough to avoid the undesirable damage. Total energy of all of the pulses is high enough to remove the selected target link structure while also avoiding the undesirable damage to other link structures in the set of link structures. The laser output provides for a relative energy process window of 30% or greater for link pitches in a range of about 1 micron to about 2 microns.

The step of applying may be carried out with a semiconductor laser diode having a wavelength in the range of about 1.0 μm to about 1.55 μm, at least one fiber optic amplifier, and at least one wavelength shifter that shifts the wavelength of the diode to a near infrared or visible wavelength.

The wavelength of the laser diode may be about 1.55 μm, the shifter may be a frequency doubler, and the shifted wavelength may be about 0.75 μm.

The shifter may be a frequency tripler and the shifted wavelength may be a visible wavelength.

The pulse width of substantially all of the pulses may correspond to a duration wherein a fluence threshold for selected target link structure removal may be substantially proportional to the square root of the pulse width, whereby the selected target link structure may be removed in a thermal manner.

The selected target link structure may be covered by one or more overlying passivation layers, wherein the power density of one or more pulses may create a thermal shock to the one or more overlying passivation layers and may remove the one or more overlying passivation layers and the selected target link structure. The removal of the one or more overlying passivation layers and the selected target link structure may occur as a result of both thermo-mechanical stress and ablation.

The one or more overlying passivation layers may be inorganic passivation layers having absorption edges in a range of ultraviolet wavelengths, and wherein the pulse power densities may be less than about $10^{12}$ W/cm$^2$.

Pulse width of at least one of the pulses may be in the range of about 30 ps to about 60 ps.

The focused laser output may have a dimension that is less than about 1.5 microns.

Focused laser output may include at least one pulse focused to a non-round spot to improve energy enclosure of the focused laser output within the selected target link structure.

The number of pulses and speed of the motion may cause a displacement of the laser output to exceed a predetermined tolerance. The method may further include deflecting the pulses to direct the pulses to locations within the tolerance.

The step of deflecting may be carried out with an acousto-optic device or an electro-optic device.

The method may further include spatially splitting at least one pulse of the laser output to form a group of spatially split pulses. The method may further include selectively directing at least one of the spatially split pulses to the selected target link structure, to a second selected target link structure, or to both of the selected target link structures.

The step of applying may be carried out with multiple laser sources. The method may further include optically combining outputs of the laser sources into a common optical path.

The laser sources may be of different types, and at least one of the laser sources may include a semiconductor laser diode.

The number of pulses may be about 70-200.

At least one of the pulses may have energy of about 5 nJ or less.

The energy of substantially all of the pulses may be about 1 nJ or more.

The focused laser output may produce a heat affected zone having a dimension in a range of about 0.1 micron to about 0.85 microns.

The focused laser output may have a dimension that is less than about 1.0 micron.

At least two immediately adjacent pulses of the laser output may have a temporal spacing in the range of about 2 nanoseconds to about 10 nanoseconds, thereby corresponding to an effective repetition rate in the range of about 100 MHz to about 500 MHz. The temporal spacing may exceed a time interval for dissipation of a vapor/plasma plume produced by a previous laser pulse interaction with the selected target link structure and the link structures adjacent the selected target link structure.

The temporal spacing between substantially all immediately adjacent pulses may be about 5 nanoseconds or greater.

The pulse power densities may be in the range of about $10^9$ to about $10^{11}$ W/cm$^2$. At least one pulse may have a pulse width in the range of a few picoseconds to less than about 50 picoseconds.

Yet still further in carrying out the above objects and other objects of the present invention, a method of removing a target link structure of a circuit fabricated on a substrate without causing undesirable damage to the substrate, any dielectric layers between the target link structure and the substrate, or link structures adjacent to the target link structure is provided. The method includes applying a focused laser output to the target link structure to remove the target link structure during motion of the substrate relative to the laser output. The laser output has about 70 to 200 pulses. Substantially all of the pulses have a pulse width less than about 100 picoseconds and corresponding pulse power densities in the range of at least about $10^{10}$ W/cm$^2$ to less than about $10^{12}$ W/cm$^2$ at the target link structure, and a wavelength of 1 micron or less. The pulses provide for a relative energy process window of 30% or greater for link pitches in a range of about 1 to about 2 microns.

The wavelength may be less than about 800 nm. One of the pulses may have a pulse width of between about 30 picoseconds and about 60 picoseconds.

The step of applying may be carried out with a semiconductor laser diode having a wavelength in the range of about 1.0 μm to about 1.55 μm, at least one fiber optic amplifier, and at least one wavelength shifter that shifts the wavelength of the diode to less than 1 micron.

The wavelength of the laser diode may be about 1.55 μm and the shifter may be a frequency doubler and the shifted wavelength may be about 0.75 microns.

The shifter may be a frequency tripler and the shifted wavelength may be a visible wavelength.

The pulse power densities may be in the range of about $10^9$ to about $10^{11}$ W/cm$^2$. At least one of the pulses may have a pulse width in the range of a few picoseconds to less than about 50 picoseconds.

The number of pulses and speed of the motion may cause a displacement of the laser output to exceed a predetermined tolerance. The method may further include deflecting the pulses to direct the pulses to locations within the tolerance.

The step of deflecting may be carried out with an acousto-optic device or an electro-optic device.

Yet still further in carrying out the above objects and other objects of the present invention, a system for removing a target link structure of a circuit fabricated on a substrate without causing undesirable damage to the substrate, any dielectric layers between the target link structure and the substrate, or link structures adjacent the target link structure is provided. The target link structure is in a set of link structures. At least some link structures in the set of link structures are separated by a center-to-center spacing of less than 2 μm. The system includes means including a laser subsystem and an optical subsystem for applying a focused laser output to the target link structure to remove the target link structure during motion of the substrate relative to the laser output. The laser output has at least about 70 pulses. Substantially all of the pulses have a pulse width less than about 100 picoseconds and corresponding pulse power densities in the range of at least about $10^9$ W/cm$^2$ to less than about $10^{12}$ W/cm$^2$ at the target link structure, and a wavelength of about 1.2 microns or less. The power density of the pulses is low enough to avoid the undesirable damage. The total energy of all of the pulses is high enough to remove the target link structure while also avoiding the undesirable damage to the other link structures in the set of link structures. The pulses provide for a relative energy process window of 30% or greater for link pitches in a range of about 1 micron to about 2 microns. The system further includes a positioning subsystem for positioning the focused laser output onto the target link structure.

The wavelength may be less than about 800 nm.

The laser subsystem may include a semiconductor laser diode having a wavelength in the range of about 1.0 μm to about 1.55 μm, at least one fiber optic amplifier, and at least one wavelength shifter that shifts the wavelength of the diode to less than 1.2 microns.

The shifter may be is a frequency doubler and the shifted wavelength may be about 0.75 microns.

The shifter may be a frequency tripler and the shifted wavelength may be a visible wavelength.

The pulse power densities may be in the range of about $10^9$ to about $10^{11}$ W/cm$^2$. At least one of the pulses may have a pulse width in the range of a few picoseconds to less than about 50 picoseconds.

The number of pulses and speed of the motion may cause a displacement of the laser output to exceed a predetermined tolerance. The system may further include a high-speed beam deflector to direct the pulses to locations within the tolerance.

The deflector may be an acousto-optic device or an electro-optic device.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

These and other features, aspects, and advantages of the present invention will become better understood with regard to the following description, appended claims, and accompanying drawings where:

FIGS. 2a-2b are block diagrams showing some elements of alternative solid-state laser subsystems, each having a master oscillator and power amplifier (MOPA), which may be included in at least one embodiment of the present invention;

FIG. 5d is a graph illustrating, by way of example, the dependence of the absorption coefficient of Silicon on wavelength and shows exemplary laser wavelengths corresponding to embodiments of the present invention;

FIGS. 8a-8e are schematic diagrams showing details of exemplary master oscillator power amplifier (MOPA) configurations which may be used in at least one embodiment of the present invention, wherein a seed laser is amplified with at least one fiber-optic amplifier to produce picosecond pulses and including at least one modulator for selecting pulses;

DETAILED DESCRIPTION OF THE PREFERRED EMBODIMENT

Overview—Laser System Architecture

Figure 1A:
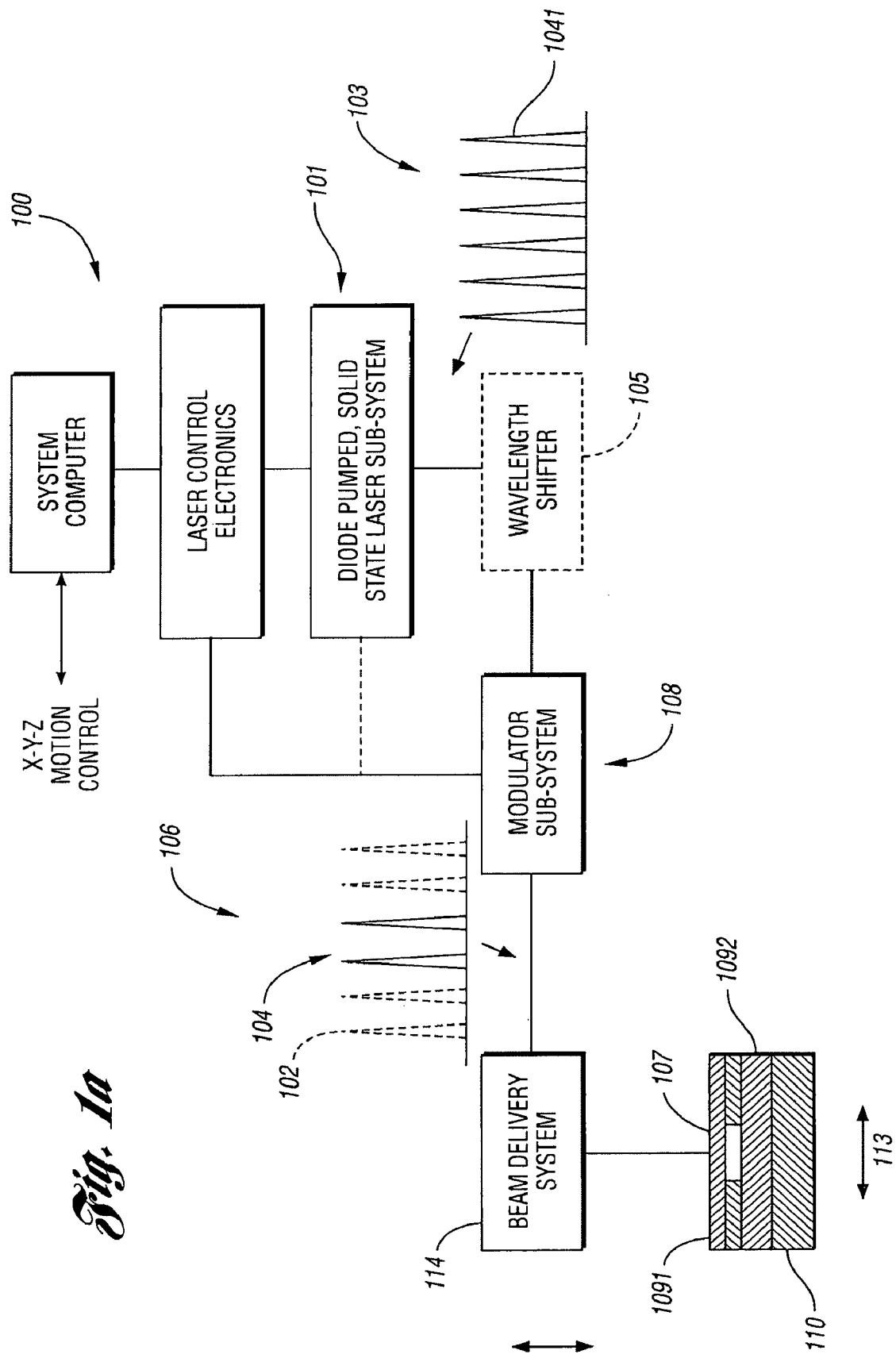
FIG. 1a is a block diagram showing a portion of a laser processing system for link removal using at least one pulse in at least one embodiment of the present invention.

Referring to FIG. 1a, a block diagram illustrating a portion of a laser processing system 100 for removal of an electrically conductive link 107 using at least one output pulse 104 having a picosecond pulse width (i.e., pulse duration, etc.) 1041 (e.g., as measured at the half power point) and shows some major system components included in at least one embodiment of the present invention is shown. At least one embodiment of the invention may include a diode-pumped, solid-state laser in sub-system 101 to produce intermediate pulses 103 having pulse widths 1041 in a preferred picosecond range. The laser may be a commercially available diode-pumped, solid-state (active or passive) mode-locked laser, for instance. For operation at a preferred wavelength the output 103 of the system 101 may be shifted in wavelength by optional shifter 105 (e.g., a harmonic generator) for example from a near infrared wavelength to a visible or near UV wavelength.

A single pulse, or plurality of pulses may be selected and delivered to a link 107, and the delivered pulses may have a pre-determined pulse width and time interval between pulses ("temporal spacing") based on a physical property of at least one of the link 107, substrate 110, upper dielectric layer 1091, and lower dielectric layer 1092. The beam delivery system may include polarization control, relay optics, beam expansion, zoom optics, and an objective lens for producing a nearly diffraction limited spot at link 107. Optional external modulator sub-system 108 may be operated under computer control to provide pulses on demand and vary the power of the pulses. By way of example, pulses 102 within the group of pulses 106 may be omitted (as depicted by the dashed lines). U.S. Pat. Nos. 5,998,759 and 6,281,471 (e.g., col. 12, line 63-col. 14, line 33 and the associated drawings of the '471 patent) teach the use of a modulator to provide a pulse to irradiate a link on demand during relative motion of the link and laser beam in a laser processing system.

Figure 1B:
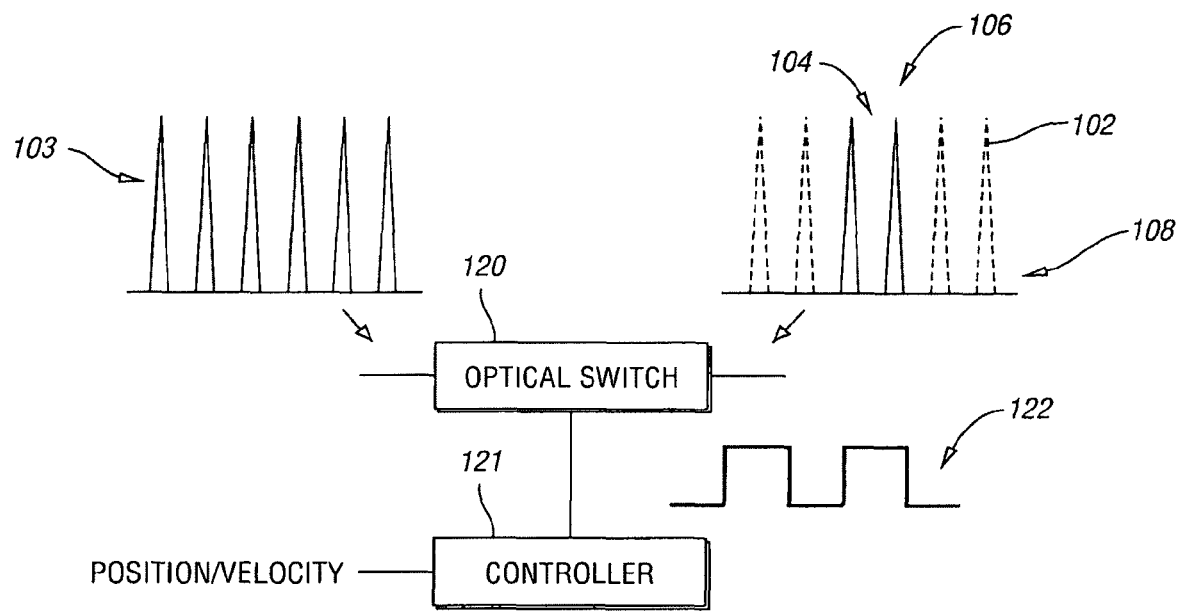
FIG. 1b shows a block diagram of a portion of the external modulator sub-system of FIG. 1a wherein a portion of an amplified pulse train is controllably selected for "on-the-fly" processing of links.

Referring to FIG. 1b, a block diagram of a portion of the external modulator sub-system 108 of FIG. 1a is shown, wherein a portion of a pulse train 103 is controllably selected for processing of links during relative motion between substrate 110 and the laser beam ("on the fly"). The motion may be in three dimensions: X motion 113, Y motion (not shown) of substrate 110 which is generally mounted on a wafer stage, and Z axis motion of at least one optical element 114 within the beam delivery system. Reference is made to U.S. Pat. Nos. 6,114,118 and 6,483,071 assigned to the assignee of the present invention for precision positioning methods and systems for positioning of the wafer and the laser beam waist relative to a link position. Controller 121 generally produces control signals 122 based on position information, velocity information, or both position and velocity information relating a link position to a laser beam position. Control signals 122 generally gate (i.e., control) an optical switch 120. The optical switch 120 generally provides output pulses 106 which are a portion of the input pulse train 103. Hence, the generated pulses 103 may have a controlled output repetition rate and temporal spacing when the modulator (e.g., the modulator 108) is used to select the at least one output pulse 104 that irradiates one or more links (or other microscope structure). At least one optical element 114 within the beam delivery system may be used to precisely position the beam waist at high speed and to further optimize the delivery of the focused output pulses.

Figure 1C:
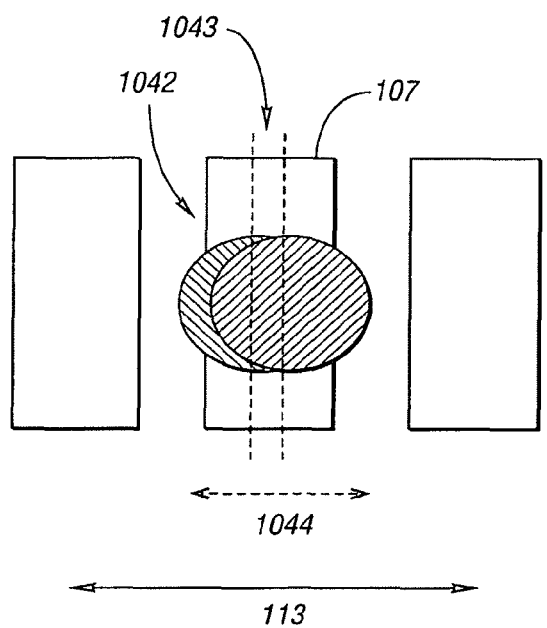
FIG. 1c is a top schematic view (not to scale), of a target link in a row of links showing, by way of example, focused laser output on a target link structure during motion of the link relative to a laser beam.

Referring FIG. 1c, exemplary pulsed laser output on target link 107 includes two focused laser pulses 1042, each having an identical spot size, corresponding to selected pulses 104. The distance 1043 corresponds to the temporal spacing between the pulses during relative motion 113. If distance 1043 is a relatively small fraction of the link width, for instance less than 25%, the fraction of energy enclosed in the link will approximate perfect spot positioning. Distance (or displacement) 1044 generally represents an effective dimension of the laser output, which equals the laser spot size for perfect placement. As the temporal pulse spacing increases, the speed of relative motion increases, or with finer link pitch (center to center spacing) 1043 is to receive increasing consideration.

Published U.S. Patent Application 2002/0167581, assigned to the assignee of the present invention and incorporated by reference herein, describes various methods and sub-systems to direct laser pulses to one or more links. The optical sub-systems or variants, which generally include a high-speed, single axis deflector, may be incorporated within the beam delivery system of FIG. 1a as required. Specific reference is made to FIGS. 19 and 20 of '581 and the corresponding sections of the description for further information of the '581 disclosure. Further, the focused output may include a plurality of spots having at least one non-identical spot distribution or power density. For instance, FIG. 17 of the disclosure illustrates a focused pulse used as a "cleaning beam."

Referring to FIG. 2a, a block diagram of additional details of one alternative solid-state laser sub-system which may be included in an embodiment of the present invention is shown. A seed laser (e.g., oscillator 211) produces a pulse train 214, the pulses generally having sufficient energy suitable for amplification with laser amplifier 212. The seed laser may be "free running" at a predetermined rate or "gain switched" to produce pulses under computer control. At least a portion of the pulse train is amplified to obtain the necessary laser pulse energy to sever a memory redundancy link, for instance to an energy level wherein the link is severed (e.g., removed) with a single pulse. One practical consideration for stable and reliable operation of pulsed laser amplifiers is operation within the rated average power. The operational considerations lead to an engineering tradeoff between the energy of a given pulse, the number of pulses, and the repetition rate.

In one alternative arrangement, shown in FIG. 2b (not to scale), a portion of pulse train 214 may be controllably selected with a suitable modulator arrangement 1081 (similar or identical to 108 of FIG. 1a) for processing of links during relative motion between substrate 110 and the laser beam ("on the fly"), however prior to amplification 212 of the pulse train to an energy level for link processing. A "down counting," "divide down," or "pulse picking" operation may be used to match a repetition rate of laser amplifier 212, which may be orders of magnitude below the repetition rate of the seed laser 211. For example, if R is the repetition rate of pulse train 214, then R/n will be the repetition rate at the output of the modulator 1081 when every n'th pulse is selected. If 214 represents a 50 MHz pulse train, the output of the modulator will be 50 KHz when n=1000. In at least one embodiment, the pulse train repetition rate may be divided by a non-integer (e.g., 19.98) and varied over a relatively small range to synchronize the selected pulses with the position of the link, thereby compensating for motion system variations. Such an operation may be performed by controller 121 in either or both 108, 1081, and may be based on position and/or velocity information.

In at least one embodiment of the present invention, a plurality of closely pulses may be selected. By way of example, output 103, 106 of laser amplifier 212 shows three pairs of consecutive amplified pulses selected from pulse train 214, a given pair which may then be selectively applied to link 107, while providing a reduced input repetition rate and low average input power for amplifier 212. If 214 represents a 100 MHz pulse train, the spacing between the consecutive output pulses of a pair will be 10 nanoseconds. Throughput and repetition rate are generally related. Preferably the amplifier output repetition rate will be sufficient to provide rapid link processing rates and "pulse on demand" capability, while limiting the complexity of system position and/or velocity control. Preferably, the three exemplary pairs at 103,106 at the amplifier output may be applied to as many as three consecutive links during relative motion 113 of the link and laser beam. External modulator 108 may be used to block the laser energy from links which are not to be processed.

Likewise, dependent upon the spectral response of the amplifier 212, optional wavelength shifter 1051 may be used to match the wavelength of the seed laser 211 to a favorable (or compatible) wavelength range of amplifier 212. Modulator sub-system 1081 and the wavelength shifter 1051 may be used alone or in combination with sub-system 108 for controlling the final pulse temporal spacing and energy level as appropriate, depending upon specific design criteria of a particular application.

Figure 3:
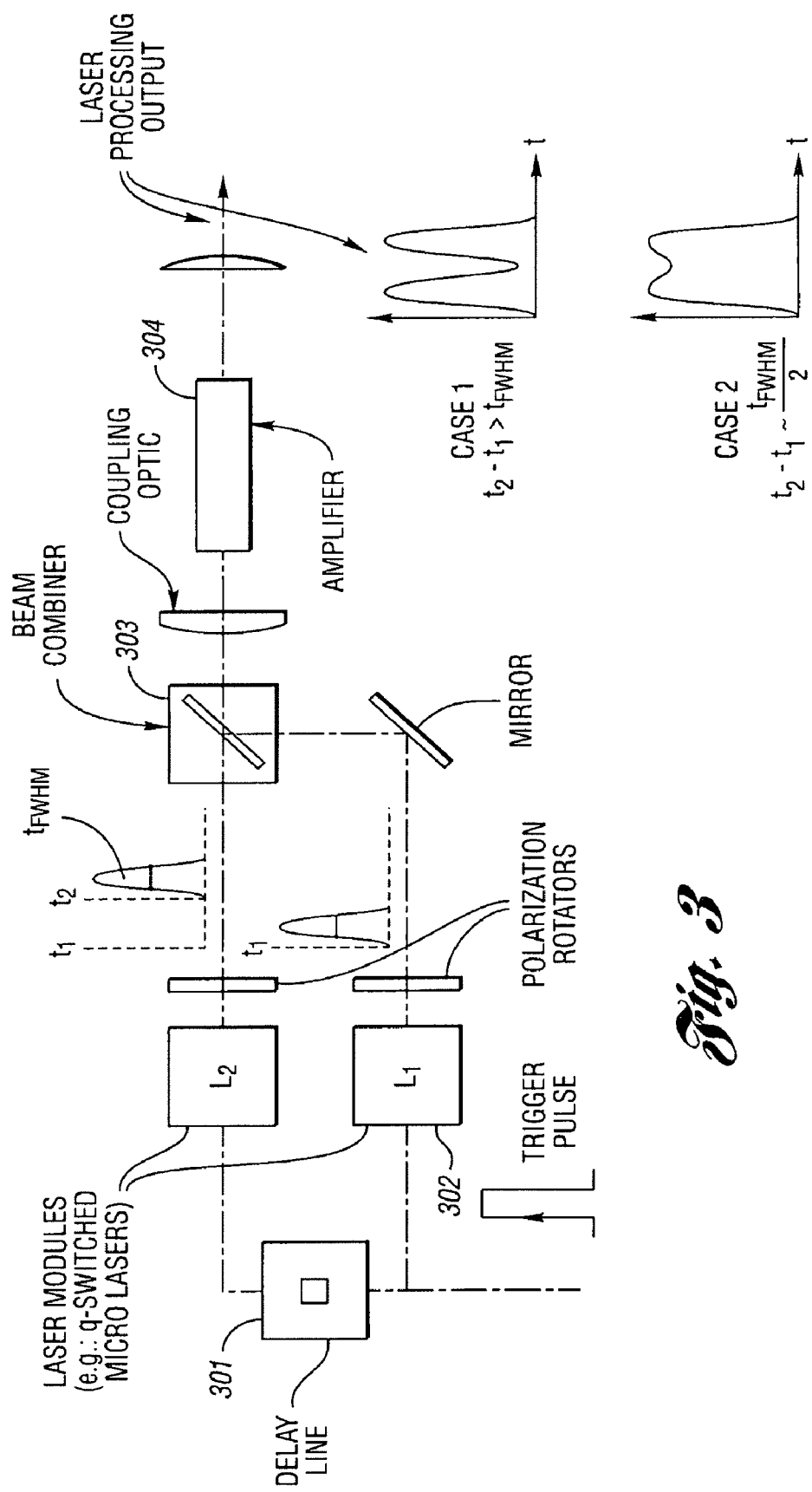
FIG. 3 is a schematic diagram showing one arrangement for combining laser pulses or generating a sequence of closely spaced pulses using multiple lasers with delayed triggering.

Referring to FIG. 3, yet another alternative arrangement for combining laser pulses or generating a sequence of closely spaced pulses using multiple lasers with delayed triggering is shown. A pre-determined delay (e.g., $t_1$ to $t_2$) between trigger pulses may determine the time interval for application of a plurality of pulses. The combined output may provide seed pulses for an optical amplifier. For example, two or more pulses (or groups of pulses) may be used to sever link 107. The arrangement may be used to provide fine control of the temporal pulse spacing (e.g., 2-10 nanoseconds for a pulse pair, 100-500 MHz effective rate or "burst rate").

As disclosed in U.S. Patent Application Publication Number 2002/0167581 ('581), incorporated by reference herein and assigned to the assignee of the present invention, the laser system may include a programmable digital delay line 301 for controlling the pulse temporal spacing t2-t1, lasers 302, a polarizing cube 303 for beam combining, and optional amplifier 304 to raise the energy level as required. By way of example, specific reference is made to paragraphs 120-122, 194-197, and the claims of '581 for additional details.

A laser wavelength within sub-system 101 will generally be in a range of about 0.150 microns to 1.3-1.55 microns, the latter range corresponding to diode laser wavelengths used in high-speed telecommunications. In one example, the laser wavelength may be frequency multiplied (e.g., tripled) or Raman shifted with shifter 105 to a near IR, visible, or UV wavelength.

Laser Parameters and Link Removal

With a trend of decreasing link pitch and dimensions (i.e., fine pitch links), at least three parameters need to be jointly considered for removing a link 107 without damaging either the substrate 110 or adjacent links (not shown) which may not require processing: (a) the laser beam size on the target and its focal depth; (b) the beam positioning accuracy (e.g., the laser beam waist position relative to the link in three dimensions—during controlled X-Y motion and Z-axis motion of the at least one element 114, for example); and (c) the heat affected zone (HAZ).

Figure 5A:
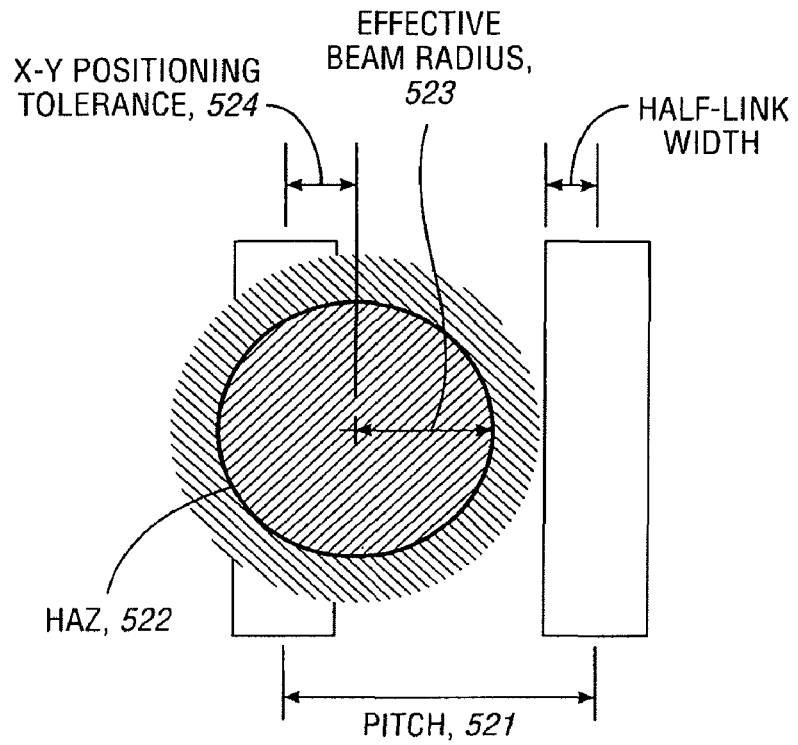
FIG. 5a is a graph illustrating, by way of example, a relationship between a heat affected zone (HAZ), spot size, and a link pitch.

Refer to FIG. 5a with link pitch 521 in the range of 3-5 microns, the theoretical minimum pitch follows the formula:

$$\text{Minimum Pitch} = \text{Beam Radius} + \text{Positioning Error} + 0.5 \text{ Link Width} \quad (1)$$

where the thermal effect by the laser beam is considered negligible.

For example, the GSI Lumonics Model M430 Memory Repair System, manufactured by the assignee of the present invention, provides a typical spot size of about 1.6 microns, and positioning error of about +/−0.2 microns. The typical pulse width is about 4-10 nanoseconds and corresponds to a heat affected zone of about 0.85-1.4 microns.

The model M430 system is capable of processing links with minimum pitches of about 2 microns (assuming a link width of about 0.5 microns).

However, as the pitch approaches the dimension that is comparable to the thermal diffusion length, thermal effects within the region of link 107 may have increasing significance. The formula then becomes:

$$\text{Minimum Pitch} = \text{Beam Radius} + \text{Positioning Error} + 0.5 \text{ Link Width} + \text{HAZ} \quad (2)$$

where HAZ (Heat Affected Zone) 522 is a measure of the thermal effect. The heat-affected zone (HAZ) is generally determined by $(D^*t)^{0.5}$, where D is thermal diffusion coefficient and the laser pulse width. The actual value for the depth to which material is molten or vaporized depends also on the actual energy and power density on the target.

The HAZ may extend beyond the focused spot 523 and adversely affect peripheral areas adjacent to the spot. In some cases, the peripheral area affected may be several times greater than the spot itself. The relative large HAZ generally makes the laser process less controllable and less precise. In the case of link blowing, relatively large HAZ size may also be one of the limiting factors to the upper limit of the process window (neighboring links damage).

A diffraction limited spot and a short laser wavelength (e.g., 0.355 microns) may mitigate the problem to some degree, provided the spot is properly positioned relative to the link. However, if the positioning tolerance 524 of the system (including the X, Y, Z motion sub-system) is +/−0.1 microns (a somewhat stringent requirement for high-speed link processing), a spot size of about 0.58 microns may be needed to deliver the laser beam to a 0.38 micron wide link. Assuming a wavelength of 0.355 microns, and a 10 nanosecond (ns) pulse width, the estimated HAZ is about 1.3 microns. As such, a practical limit for processing links may correspond to about 1.9 micron pitch. Hence, a shorter pulse width is generally desirable.

Reducing the pulse width also generally reduces the HAZ. However, when thermal effect becomes very small compared to beam size and position error, further reducing the thermal effect before improving other significant contributors (e.g., beam size and positioning) may become unnecessary. The reduction in thermal effect from the nanosecond range to the picosecond range may be sufficient to process the finer pitch links. Further reduce the pulse width down to femtosecond range to eliminate undesirable thermal effects may be avoided for processes to remove (i.e., sever, "blow," ablate, etc.) fine pitch links.

In accordance with the present invention, a limited thermal interaction generally occurs within a heat affected zone that is substantially less than cumulative tolerance of a link pitch and a relative position of the laser output relative to the target structure. For instance, a heat affected zone (HAZ) diameter of about 0.3 microns to about 1 micron will generally provide for improved processing of link pitch of 2 microns or less. Preferably, a HAZ will be less than the positioning tolerance of the laser output in three dimensions (e.g., less than 0.1 microns in each direction, and generally is considered negligible).

U.S. Pat. No. 6,281,471, incorporated by reference herein, elaborates on the rationale for the use of a short, fast rise time pulse. Specifically, col. 4, line 45-col. 5, line 19 elaborates on the effects decreasing reflectivity to improve coupling to target material. If the irradiance on a metal target structure (e.g., aluminum) is greater than about $10^9$ W/cm$^2$, the reflectivity of the target structure is reduced and coupling of the laser energy is improved. Thermal diffusivity (related to HAZ) generally varies as the square root of pulse width. A short laser pulse generally reduces or prevents heat dissipating to the substrate below the melting link and also heat conducting laterally to the material contiguous to the link.

Figure 5B:
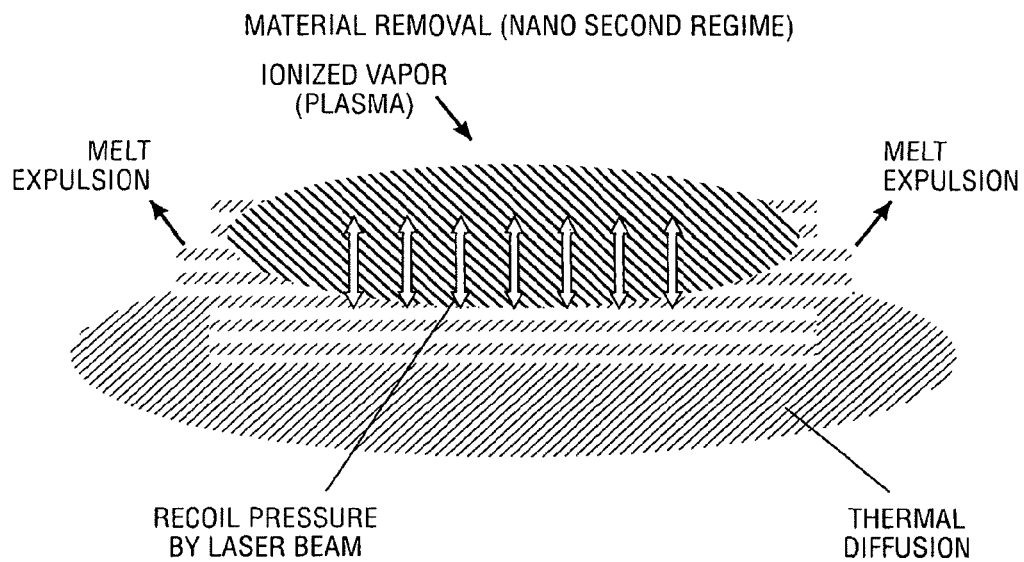
FIG. 5b illustrates, by way of example, material removal with nanosecond pulses.

As the link pitch becomes finer thermal interaction with nanosecond pulses may be increasingly chaotic, resulting in poor precision for link removal. As illustrated in FIG. 5b, a relatively large volume of material may be heated and melted, and material removal occurs through melt expulsion driven by vapor pressure and the recoil of laser radiation pressure. At a fine scale the shape and volume of removed material may be irregular and include a non-acceptable large statistical variation. With picosecond high peak power pulses the interaction may become non-linear, initially with avalanche ionization where the reflectivity is reduced as a result of the high free electron density in metals, with decreased statistical variation. With such short pulses the laser energy is generally confined to a thin layer and vaporization generally occurs rapidly. Material removal generally becomes more precise and deterministic, with reduced laser fluence to initiate ablation. Material removal with picosecond pulses may further include removal of heat from the laser processing region by material ejection (solid and vapor). The link removal process at the picosecond scale, for instance with the presence of an overlying dielectric layer 1091 and inner layer 1092, may be a mixture of removal with ablation and thermo-mechanical stress. Removal of the target link structure is generally assisted by heat removal from a link processing region by material ejection at the pulse width and power density.

Figure 5C:
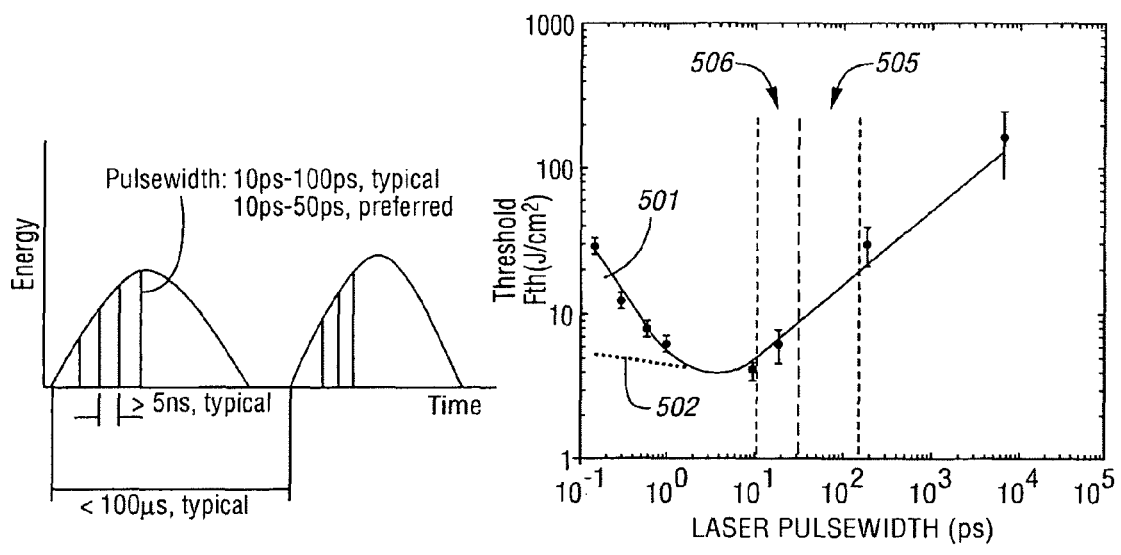
FIG. 5c is a graph illustrating, by way of example, dependence of fluence threshold on laser pulse width and shows exemplary pulse width ranges and exemplary pulse parameters corresponding to embodiments of the present invention.
Figure 5B:
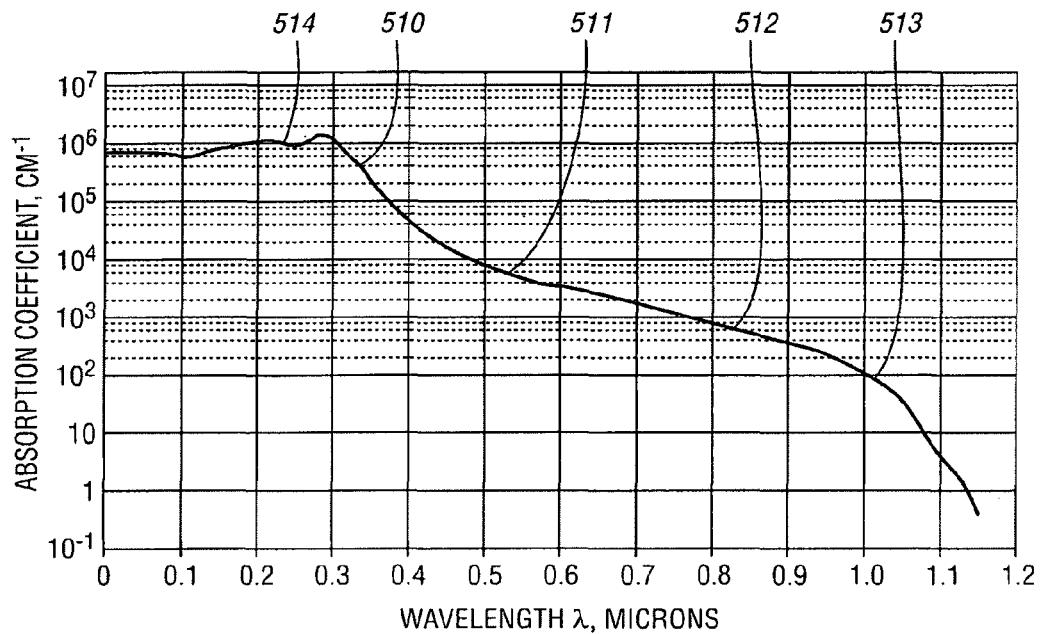

By way of example, FIG. 5c shows variation in fluence threshold for two exemplary dielectric materials (e.g., see U.S. Pat. No. 5,656,186 and the publication Du et al., "Laser-Induced Breakdown by Impact Ionization in SiO$_2$ with pulse widths from 7 ns to 150 fs," APPL. PHYS., Lett., 64 (23), Jun. 6, 1994, pp. 3071-3073. As is well known, the fluence threshold is generally much lower for metals (e.g., ten times or more) as a result of the higher free electron density. Below the breakdown point the threshold 501, 502 varies with material but the statistical variation (shown by error bars) is generally relatively small. In the illustrated example (provided with the published data in the publication), 501 varies as 1/(pulse-width) whereas 502 is taken as approximately constant (as illustrated in the '186 patent). Above the breakdown point, an approximate square root relation holds, but increasing variation with pulse width is apparent, particularly at the nanosecond scale.

A characteristic pulse width of the break down point of metals, may typically be about 10 ps (e.g., see U.S. Pat. No. 5,656,186). In accordance with the present invention, the typical laser pulse width is less than 1 nanosecond, and most preferably much closer to the characteristic pulse width of the breakdown point so that detrimental thermal effects are negligible (e.g., the present invention produces reduced HAZ and statistical variation). However, the link removal process of the present invention is generally a thermal process. The interaction between the laser pulse and the material is mainly a thermal (though greatly reduced) process since the laser pulse width is longer than that of the breakdown point, and preferably close to the breakdown point.

The present invention will generally provide an efficient link removal process rather than a slow etching process defined by the optical absorption depth, which is only on the order of a few nanometers per pulse for most of metals. Since the breakdown point is material dependent, the lower end of the pulse width is therefore also material dependent. A minimum pulse preferred pulse width may be in the range of a few picoseconds (ps) to about 10 ps. A maximum pulse width is generally less than about 1 nanosecond (ns) and will generally determined by the heat affected zone allowable. Generally a pulse width of the present invention will in the range from above the breakdown point to less than 1 ns. A pulse width may be in the range 505 of about 10-100 ps, for example 40-100 ps. A most preferred pulse width is in the range 506 of about 10 ps to about 40 ps or about 10 ps to about 50 ps.

The laser systems which produce picosecond pulses are typically simpler, more reliable and stable, and more cost effective as compared to femtosecond lasers. A significant difference is implementation of pulse compression for femtosecond generation of high peak power pulses.

Numerous references further elaborate on interaction in the femtosecond-picosecond pulse range. For example, Chichkov et al., "Femtosecond, Picosecond, and Nanosecond Laser Ablation of Solids," APPL. PHYS., A 63, 109-115, 1196 provides theoretical background and experimental results. Femtosecond pulses were found to have thermal conduction into a target that can be neglected to a good approximation, and the process regarded as a direct transition form solid to vapor, resulting in precise laser processing. The ablation depth has a logarithmic dependence on laser pulse fluence. With picosecond pulses, ablation is accompanied with heat conduction and formation of a melted zone within the target, for instance a metal. When heat conduction into the target is neglected, (which may be a rather crude assumption), then the logarithmic dependence of the ablation depth on fluence is also generally possible with picosecond pulses. However, processing in the nanosecond range has been generally regarded as much more complicated as a result of thermal wave propagation and formation of a large layer of melted material.

Jandeleit et al., "Picosecond Laser Ablation of Thin Copper Films," APPL. PHYS., A 63, 117-121, 1996, disclosed results of ablation experiments wherein holes were drilled in thin copper films on fused silica using picosecond pulses. Although high intensity picosecond pulses having pulse widths greater than the characteristic pulse width of the breakdown point generally follow the square root relationship, the reduced heat affected zone and lower heat load provide rapid heating and removal of target material when compared to nanosecond and longer pulses. An intensity of about $10^{10}$-$10^{11}$ W/cm$^2$ over about a 3.1 um diameter spot removed (on the average) about 0.1-0.2 μm of material per each 40 ps pulse at a wavelength of 1.053 microns. Comparison of the results with the known optical absorption depth of copper at 1.053 microns indicated that heat conduction generally determines the ablation depth. The pulse-pulse variation in the material removed may be significant (e.g., 2:1). However, the HAZ was relatively small and collateral damage minimal.

Hence, the benefit of a pulse width from about 10-25 ps down to below the breakdown point (typically less than 10 ps) is generally not so significant as compared to benefits provided by the beam spot size reduction and positioning error improvement for the overall system capability. In addition, the cost of femtosecond laser sources is typically much more than the cost of picosecond laser systems, particularly fiber laser based picosecond laser systems.

Link processing includes removal of a target structure, typically a metal thin film. The link is typically surrounded by materials (e.g., passivation layers 1091, 1092, substrate 110) having dissimilar thermal and optical properties. As such, some multi-material interaction mechanisms may be somewhat complex compared to material processing interaction with a homogeneous "bulk" material. At least one dimension (e.g., link width) is typically on the order of a wavelength of visible or UV light. Also, with finer link pitch technology that is emerging, the fraction of the spot energy that enclosed within the link dimension needs careful consideration by a designer of link processing equipment. In at least one embodiment the laser wavelength is less than one micron, for example, 0.90 microns or less, to achieve a smaller spot size on the link in connection with the reduced pulse width.

Since the smallest spot size is generally proportional to the wavelength, any reduction in wavelength will be beneficial to the reduction of the smallest spot size achievable. In addition, the depth of focus will generally be larger for the same spot size at such shorter wavelengths. For example, for a 1064 nm laser, the diffraction limited spot size is approximately (i.e., substantially, nearly, about, essentially) 1.2 microns (diffraction limited spot size=(constant)*wavelength*f number of the lens). When the wavelength is reduced to 0.8 microns, the diffraction limited spot size will be reduced by 20% accordingly as well, i.e., to approximately 0.9 microns. Generally, for fine pitch processing a spot size of less than about 1.5 microns is preferred, and most preferably 1 micron or less. In at least one embodiment of the present invention, a non-round spot profile (e.g., an elliptical spot produced with an anamorphic optical sub-system) may be used (see, U.S. Patent Application No. 2002/0167581, for example). In particular, paragraphs 133-136 illustrate how a non-round spot may improve energy enclosure within a link in at least one embodiment.

Material variations (e.g., variations, whether by design, by process defect, or as a process by-product) may be encountered and are generally expected to further affect the process energy window as the pitch is decreased. The link may be a metal (e.g., Al, Cu, Au, etc.), polysilicon, or a refractory metal. At least one layer of Silicon Nitride ($Si_3N_4$) 1091 may cover the link, and a layer of Silicon Dioxide ($SiO_2$) 1092 may separate the substrate 110 and link 107. However, in some cases the link may not be covered with an outer layer. Additionally, the presence impurities, dopants within the substrate or dielectric layers, and next generation dielectrics (e.g., low-k polymeric materials) may each have a substantial effect on the optical properties of the materials. In a wavelength range wherein the wavelength is greater than the absorption edge of the dielectrics 1091,1092 and less than the absorption edge of the substrate 110 substrate damage may easily occur with long laser pulses.

Link 107 may be substantially reflective at the laser wavelength. In accordance with the present invention, the laser output wavelength will generally be below the absorption edge of the substrate and hence correspond to an absorbing and/or reflecting wavelength region. The laser wavelength is typically above the absorption edge of the dielectric layers 1091, 1092 which, in one example, may be inorganic, and will generally correspond to a substantially maximum transmitting region, for typical inorganic passivation layers (e.g., $Si_3N_4$, $SiO_2$, etc.) used with present semiconductor memories.

Referring to FIG. 5d, typical variation in the absorption coefficient (e.g., at room temperature) of Silicon, the absorption being very high at short wavelengths is shown. Doping (not shown) generally changes the absorption and shifts the near IR absorption edge to shorter wavelengths. Published European patent application EP 0 902 474, published 17 Mar. 1999, teaches shielding the substrate with one or more materials to avoid substrate damage. With such modifications a shorter wavelength laser (and a reduced spot size) provides for reduction of link pitch. The shielding materials may be metals, refractory metals, or dielectrics. Such modifications may also be used with the present invention to further enhance performance.

In accordance with the present invention, a laser wavelength may be in a range from below 0.4 μm to about 1.55 μm. Exemplary wavelengths may be in the UV range (e.g., 514, 212-266 nm), near UV (e.g., 510, 355 nm), visible (e.g., 511, about 500 nm, for instance 532 nm) and near IR spectrum (512, about 750-850 nm or 513, about 1 μm). It can be seen that Silicon absorption varies by about 1000:1 throughout the wavelength range. A preferred wavelength may be in the range of about 0.18 microns to about 0.55 microns. The lower limit may be determined by the absorption of a layer. With silicon substrates, both absorption and reflection increase at shorter wavelengths. Over the wavelength range of interest the Silicon semiconductor properties change dramatically from near IR dielectric-like properties to metal-like properties in the UV range. For Silicon Dioxide and Silicon Nitride, the internal transmission and single surface reflectance are substantially constant throughout the visible and near IR ranges. Spectral transmission curves for typical large bandgap dielectric materials generally show that the transmission decreases somewhat at UV wavelengths. For example, in HANDBOOK OF LASER SCIENCE AND TECHNOLOGY, the transmission range of Silicon Dioxide is specified as wavelengths greater than 0.18 μm. The absorption coefficient of both Silicon Nitride and Silicon Dioxide remains relatively low in the visible range (>400 nm) and gradually increases in the UV range.

If the predetermined wavelength is below an absorption edge of the substrate, the pulse energy density at the substrate may reduced and the process window may be increased by at least one of: (a) beam divergence (shallow depth of focus); (b) dielectric surface reflection; (c) beam diffraction; (d) multiple scattering (e.g., caused by dopants or impurities); (e) internal reflection (which may vary with the focused laser beam numerical aperture); (f) multi-layer interference; and (g) non-linear absorption within the microstructure (if the laser spot is properly positioned in three dimensions then at the leading edge of the high peak power laser pulse the free electron density in a metal increases the absorption, and link material removal may occur at a rate faster than that of the substrate. The substrate is irradiated with off-link energy (e.g., lower peak intensity) and has fewer free electrons than that of the link.

In order to process links less than 0.5 micron thick, for example, aluminum or copper links, the range of the peak energy density (Joules/$cm^2$) is about 0.2 J/$cm^2$ to 300 J/$cm^2$, with a typical value in the range 2-80 J/$cm^2$. The range of peak power density is about $5\times10^9$ W/$cm^2$ to $1.2\times10^{13}$ W/$cm^2$, with a typical value in a range of $5\times10^{10}$-$2\times10^{12}$ W/$cm^2$. For a 40 ps pulse width laser with a spot size of 1 micron, the pulse energy range for severing links less than 0.5 micron thick is generally in a range of 0.001-3 micro joules with a typical value at a range of 0.02-1 micro joules.

Either a single pulse or multiple pulses may be used to remove the link. If a single pulse is used to remove the link the picoseconds laser system is to generally provide a range of about 1-5 micro joules per pulse at a 10 KHz-120 KHz repetition rate. An exemplary range is less than about 1 microjoule to a maximum of 2 microjoules. Preferably single pulse processing will be implemented with an oscillator/amplifier configuration, for instance the seeder/amplifier configuration as shown in FIG. 2a.

In one embodiment of the present invention, multiple pulses may be used to remove the link with a picosecond laser system providing at least 0.001 micro joules (1 nanojoule (nj)) per pulse at a repetition rate of at least 1 MHz. The pulses applied to the link may be treated as a single pulse for link removal during relative motion in three-dimensions between the link and laser beam (e.g., 5-50 mm/sec along X-Y axes). In another embodiment of the present invention, about 15-20 pulses may be applied at a repetition rate of 10-100 MHz, each with about one-tenth the energy required for removal with a single pulse, while traversing a fraction of a link.

Embodiments of the present invention may also include a plurality of closely spaced amplified pulses, for instance, two or more pulses each with about 50% of the energy that is generally required to remove a link with a single pulse. Pulses may be selected with control of modulator sub-system 1081 within the laser system 101, external modulator sub-system 108, or a combination thereof.

Figure 4:
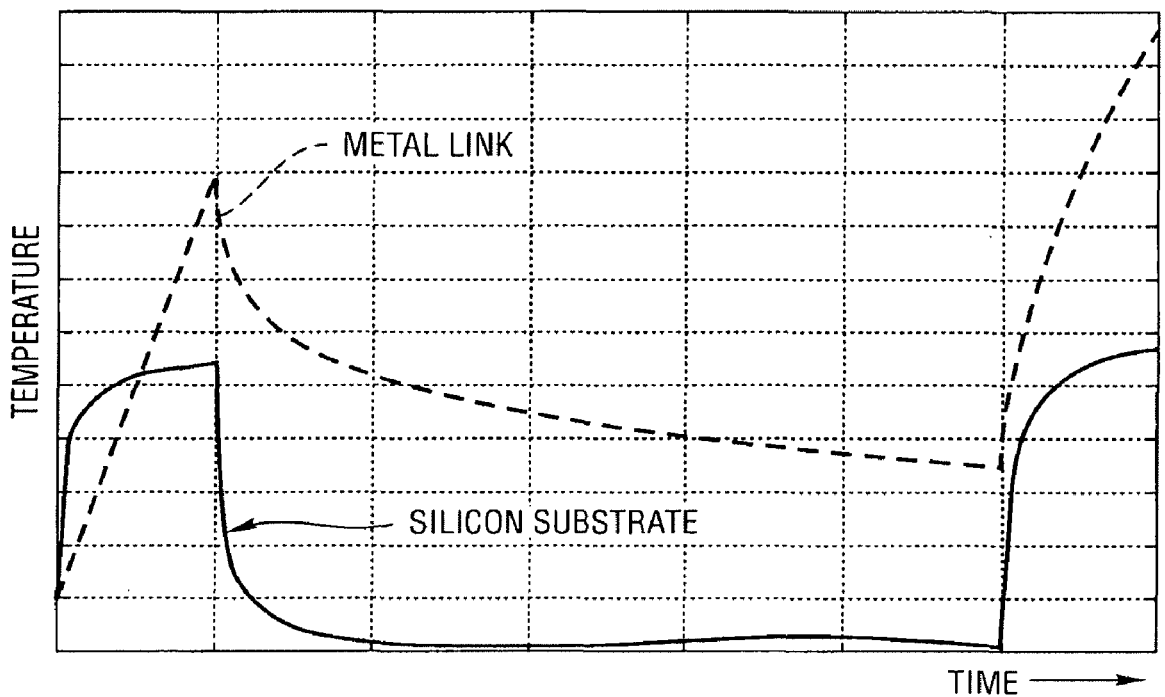
FIG. 4 is a plot showing an example simulation results of exploiting differential thermal properties of a link and the underlying substrate to remove the link without damaging the substrate by applying two pulses having a pre-determined delay.

In a multiple pulse process, the temporal spacing between the pulses used to irradiate the link on demand may be selected based on a pre-determined physical property (e.g., differential thermal properties) of the link and surrounding materials. Referring to FIG. 4, simulation results which, by way of example, demonstrate an effect of exploiting differential thermal properties of a link and the underlying substrate to remove the link without damaging the substrate by applying two pulses having a pre-determined delay are shown. According to the simulation results obtained (in this case with nanosecond pulses having a square shape), "double blast" (e.g., two pulses) with 50% energy of a "single blast" energy was very interesting. The Silicon substrate generally acts as a heat sink and cools down very fast compared to the link. As shown in FIG. 5a, the results indicated the substrate 110 to stabilized to room temperature in only 10 to 20 ns. The link 107 (copper) recovery was much slower indicating a significant differential thermal property. Based on the results, the second pulse will generally also clear debris at cut site (i.e., link removal) resulting in an "open circuit".

If, for example, a 60 MHz mode-locked system (e.g., picosecond pulses) is used, the spacing between consecutive pulses of the output pulse train may closely match the pre-determined spacing. If a larger temporal spacing is desired, a high-speed modulator arrangement may be used to select any sequence of pulses or group of pulses, for example. A higher repetition rate may be used to decrease the pulse temporal spacing, or a second laser may be provided as shown in FIG. 3. For example, two pulses, each having a pulse width in the range of about 40 ps to 100 ps and spaced by 2-10 ns may be generated. By way of example, q-switched microlasers may be used to provide pulse widths of a few nanoseconds at a repetition rates of about 10 KHz-100 KHz. Further processing of the nanosecond pulses may occur (as will be shown, for example, the embodiment shown in FIG. 8b) wherein a high-speed modulator is used to "slice" or compress the pulse to the picosecond scale, followed by amplification. Further details relating to temporal pulse shaping may be found in U.S. Pat. Nos. 6,281,471 and 4,483,005 (entitled "affecting pulse width") assigned to the assignee of the present invention.

Other physical properties may be exploited. With the application ultrashort pulses to various materials, for instance in the range of 50 femtoseconds to a few picoseconds, the plasma shielding of the laser beam is generally negligible, as taught in several references (i.e., Zhu et al., "Influence of Laser Parameters and Material Properties on Micro-Drilling with Femtosecond Laser Pulses," APPL. PHYS. A 67 (Suppl.) 5367-5371 (1999). Though not as efficient as operating in the femtosecond range, picosecond pulses having preferred pulse widths near the breakdown point and somewhat longer (e.g., a range of 5% to 25% longer) than the breakdown point may provide for better coupling of laser energy than nanosecond pulses. For example, pulses may be in the range of about 10 ps to 100 ps, and most preferably in the range of about 10 ps to about 40 or in a range of about 10 ps to about 50 ps. The coupling of energy with longer pulses, for instance 10-30 nanoseconds, may be severely degraded as a result of ejected vapor/plasma/plume. Further, the incident beam may be scattered and produce substantial off-link energy which can reduce the process energy window.

Hence, though a series of picosecond pulses may be equivalent to a multiple nanosecond pulse for the purpose of "on-the-fly" removal, the overall interaction of the laser with the material and processing results may be significantly different when a plurality of pulses each with a temporal spacing of at least several nanoseconds between pulses is used. U.S. Pat. No. 6,552,301 discloses the use of a burst of ultrafast laser pulses, each of the pulses having a pulse width less than about 10 ps, and having a time separation between individual pulses to exploit the persistence of a selected transient effect arising from an interaction of a previous pulse with the target material. Further, "Laser Micromachining of Transparent Glasses and Aluminum with ps-pulse bursts at 1054 nm," Herman, CLEO 2000, CDF3, (2000), disclosed that a 7.5 ns pulse separation mitigates plume absorption effects to some extent. A time interval may be pre-selected based on (at least) a time interval for substantial dissipation of plasma/vapor/plume after application of first a high peak power, picosecond pulse. An exemplary range is about 5 ns to several hundred nanoseconds. Additional pulses may subsequently be applied for efficient coupling.

In a related work, Lapczyna et al. [12] ablated aluminum foil with multiple, mode-locked 1.2 ps pulses at 133 MHz from a 1054 nm laser. Holes were cut through the foil with about a 2 microsecond train of 250 pulses of 1.2 ps duration with 7.5 ns pulse-to-pulse separation. The burst duration is near or within a time interval suitable for "on the fly" link processing. FIG. 2 of [12] shows the total fluence (energy density) of a pulse train and the corresponding single pulse fluence for laser micro-processing aluminum foils of varying thickness. The minimum energy range disclosed in [12], when scaled to typical spot sizes used for link blowing, would be in the range of tens of nanojoules and consistent with link blowing requirements.

Further, when picosecond pulses having high power density (e.g., of $10^9$-$10^{13}$ W/cm$^2$) are applied to the link, intensity dependent non-linear absorption, for instance within dielectric layer 1092 or other adjacent material, may attenuate incident energy after the link is removed and may reduce the possibly of substrate or collateral link damage. The presence of impurities (by design, or as a process defect or byproduct) lattice defects or various process defects may enhance non-linear absorption in one or more dielectric layers. Further, optical properties of some low-k dielectrics such as polymeric dielectrics may support controlled removal of material by non-linear absorption.

Pico Second Laser Embodiments

Solid-state laser wavelengths may be 1.3, 1.18, 1.09, 1.064, 1.053, or 1.047, microns with Neodymium (Nd) doped solid-state lasers (Nd:YAG, Nd:YLF, Nd:YVO4) or with other rare earth elements (e.g., ytterbium (Yb), neodymium (Nd), erbium (Er)) doped fiber lasers. Preferred laser wavelengths may also be the second, third, fourth, and fifth harmonics of these and other appropriate lasers to achieve small spot sizes and larger focal depths to meet the design criteria of a particular application. For example, laser sources with laser wavelengths in the UV (e.g., 355 nm from the third harmonic, 266 nm from the fourth harmonic, and 212 nm from the fifth harmonic), in the visible (e.g., 532 nm from the second harmonic), near IR wavelengths (e.g., 700-900 nm), which provide a spot size improvement relative to conventional wavelengths, may also be used. One such a laser system is a mode-locked Ti:sapphire ultra fast laser (without a compressor) which produces laser pulses with pulse widths in picosecond range in the 750 to 850 nm range. Another is the rare earth element doped fiber laser that generates wavelength in a range of 800-980 nm.

Exemplary laser sub-systems which may be included in embodiments of the present invention will now be described in more detail. In one embodiment, corresponding to FIG. 1a, a commercially available diode-pumped, passive or active mode-locked system may be included. The external modulator system 108 may be implemented to deliver the selected pulses of 106 to link 107.

Another laser configuration which may be used in at least one embodiment of the present invention is shown in FIG. 2a. In a MOPA configuration a picosecond seed laser (e.g., oscillator producing an output in a range for amplification) and (power) amplifier system is used to obtain the pulse energy required.

Figure 6A:
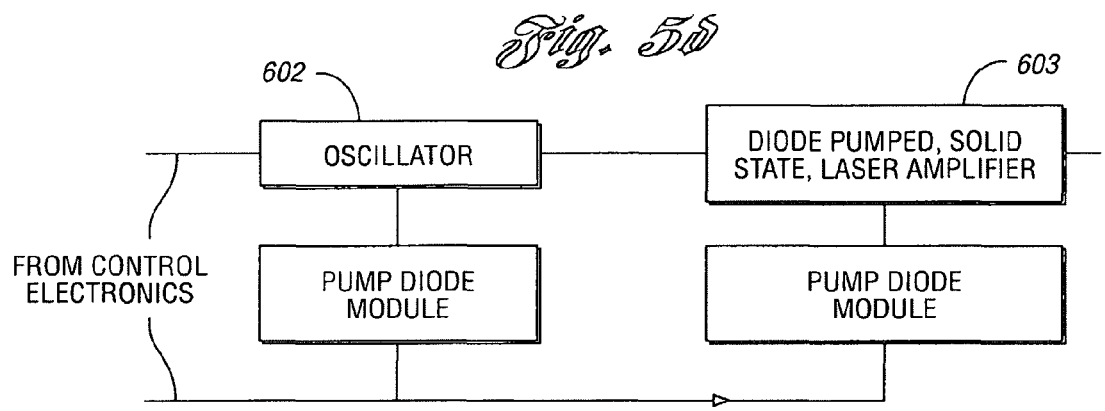
FIG. 6a is a block diagram showing elements of a laser sub-system wherein a seed laser of FIG. 2a or 2b is a diode-pumped, solid-state laser oscillator and a diode-pumped, solid-state laser amplifier is used to amplify the output of the seed laser.

Referring to FIG. 6a, a block diagram illustrating additional details of a laser sub-system wherein the seed laser 211 of either FIG. 2a or FIG. 2b is a diode-pumped, solid-state laser oscillator 602 is shown. Diode-pumped, solid-state laser amplifier 603 may be used to amplify the output of the seed laser. Oscillator 602 may be a mode-locked, diode-pumped, solid-state oscillator seed. External modulator sub-system 108 may be used to control the number of pulses on each link and the temporal spacing between the pulses. A mode-locked oscillator will generally operate at very high repetition rates (>1 MHz) compared to conventional q-switched lasers. The laser system include may also include the modulator sub-system 1081 of FIG. 2b with control signals 202 (e.g., in a typical range of 20-150 KHz) to control the number of pulses on each target while processing links during motion of the link relative to the laser beam. In any case, the seed laser (e.g., which, if suitable, may be a packaged, commercially available laser source) may include an internal pre-amplifier to amplify the pulse energy to a suitable range for power amplification with power amplifier 603.

An alternative configuration may include a diode-pumped, mode-locked, picosecond fiber laser oscillator as a seed laser

602. An all fiber laser system may be constructed if the diode-pumped, solid-state amplifier 603 is a fiber-optic amplifier.

Exemplary fiber configurations suitable for amplifying high power short pulses, particularly ultrashort pulses, are disclosed in U.S. Pat. Nos. 5,400,350, 5,701,319, and 5,818,630. Exemplary lasers include the Femtolite and Wattlite series offered by IMRA, the assignee of the '350, '319, and '630 patents. Pulses down to 0.1 ps duration with average power of 1 watt with an output wavelength in the range of 1.03-1.06 microns have been achieved with Yb-fiber amplified, Femtolite-based source. Other wavelengths, (e.g., 780 nm) and frequency multiplied (second harmonic) outputs of 1.03-1.06 micron lasers are also available from IMRA. Additional information is also available in U.S. Pat. No. 6,281,471 (assigned to the assignee of the present invention) and International Published Patent Application WO 98/92050.

Various other solid-state laser amplifier configurations may be adapted for use in at least one embodiment of the present invention. Planar waveguide technology may be well suited for high peak power, short pulse amplification. U.S. Patent Publications 2003/0161375, 2003/0160034, and 2003/0021324, assigned to the assignee of the present invention, and the associated references disclose several waveguide amplifier embodiments. The waveguide designs, though not as readily available as fiber amplifier technology, provide high peak power outputs, and good beam quality, without undesirable Raman shifting of the seed wavelength. Also, planar waveguide amplifiers may be well suited for femtosecond pulse amplifiers.

Figure 6B:
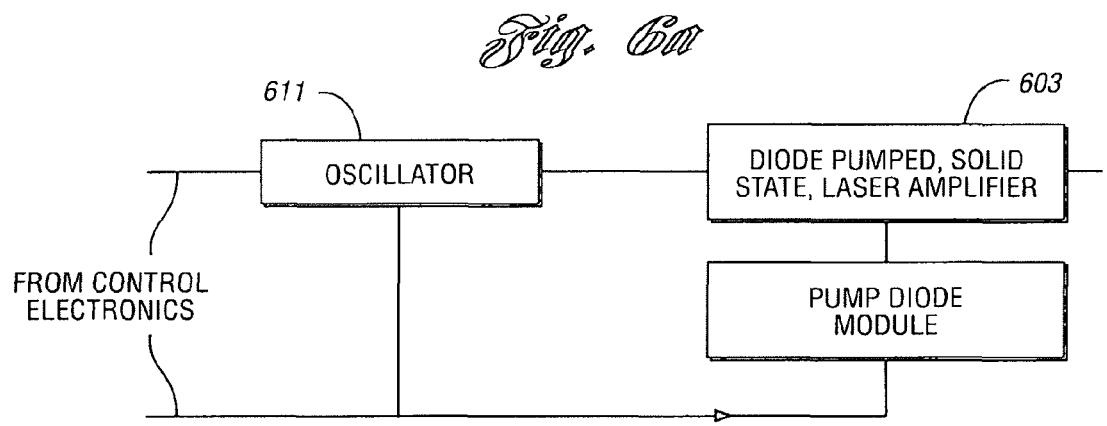
FIG. 6b is a block diagram showing elements of a laser sub-system wherein a seed laser of FIG. 2a or 2b may be a picosecond laser diode or microchip laser for producing picosecond pulses, for example.

Referring to FIG. 6b, a block diagram illustrating additional details of an alternative laser sub-system wherein the seed laser of FIG. 2 is a picosecond laser diode 611 for producing picosecond pulses is shown. The diode seed laser may be directly modulated.

Figure 8A:
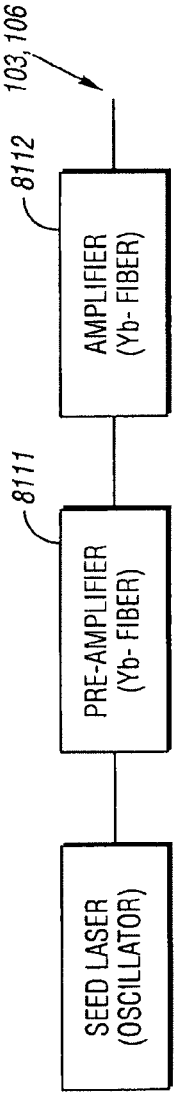
Figure 8B:
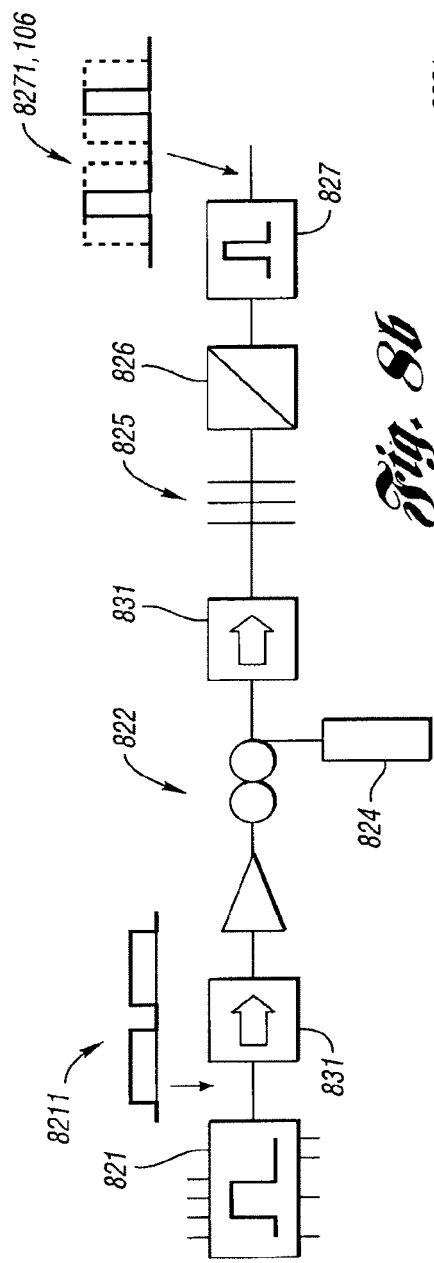

Alternatively, the diode laser may be used to produce nanosecond pulses which are further processed within the laser system to produce picosecond pulses (as will be shown in more detail, for example, in connection with FIG. 8b).

In yet another arrangement, the seed laser 611 may be an active or passive q-switched microchip laser. An example of a commercially available microlaser is the AOT-YVO-1Q available from Advanced Optical Technology. For example, AOT offers a pulsewidth of 2 nanoseconds available at a repetition rate of 20 KHz. Frequency doubled versions are also available (532 nm). Microchip lasers are also offered by JDS Uniphase. In either case, a modulator may be used to reduce the pulse width as shown in more detail, for example, in connection with FIG. 8b. A diode-pumped, fiber laser amplifier 612 may used to amplify the output of the seed laser.

A preferred embodiment may include the diode laser as the seeder and a fiber laser amplifier to obtain picosecond laser pulses. Fiber laser systems may have the advantages of compactness, excellent beam quality and control, high system reliability, ease in thermal management, and maintenance-free operation. U.S. Pat. No. 6,281,471 and WO 98/92050 discloses numerous features of master oscillator-power amplifier (MOPA) wherein a diode seed laser is amplified with a fiber amplifier.

In at least one embodiment, the temporal spacing of a sequence of the pulses may be controlled by "gain switching" of a seed laser, for example, as taught in U.S. Pat. No. 6,281,471. High-speed pulsed laser designs generally utilize q-switched, gain switched, or mode-locked operation, alone or in combination. "Pulsed pump" (e.g., real time control of pump diode module of FIG. 6a) may be used provided output stability is acceptable. U.S. Pat. No. 5,812,569 discloses an exemplary method of stabilizing the output energy of a pulsed solid-state laser.

The output of the laser sub-system 101 (and from amplifier 603) may be wavelength shifted by shifter 105. Wavelength shifters, including harmonic generation modules or other wavelength shifters may be used to shift the wavelength to shorter or longer wavelength depending on the process requirement. Wavelength shifting or conversion techniques are well known and documented. Examples of the wavelength shifter include Raman shifter, frequency up conversion or down conversion, frequency doubling, etc. For example, Concept Design Inc. provides second, third, and fourth harmonic conversion of femtosecond Ti:Sapphire outputs (fundamental wavelength in the range of 750-850 nm) resulting in available wavelengths as short as about 215 nm. Additional products which include ultrafast frequency converters are offered by Coherent, Spectra Physics, and Lumera.

Figure 7A:
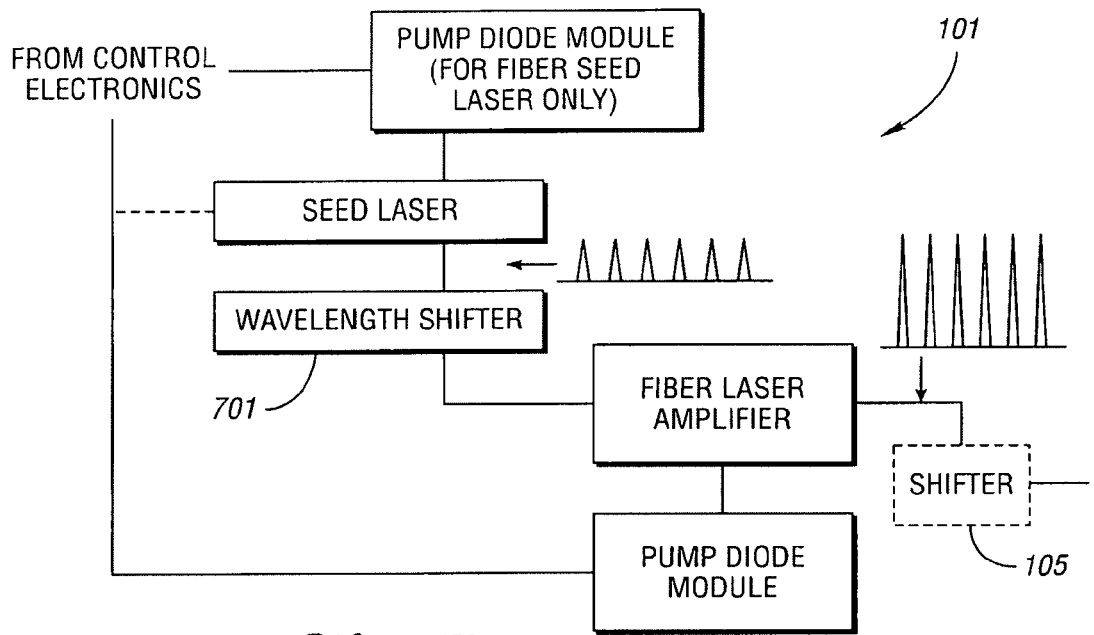
FIGS. 7a-7c are block diagrams showing additional design alternatives which may be used in an embodiment of the present invention, including configurations for at least one of amplification, wavelength shifting, and "down counting"/"pulse picking"
Figure 7B:
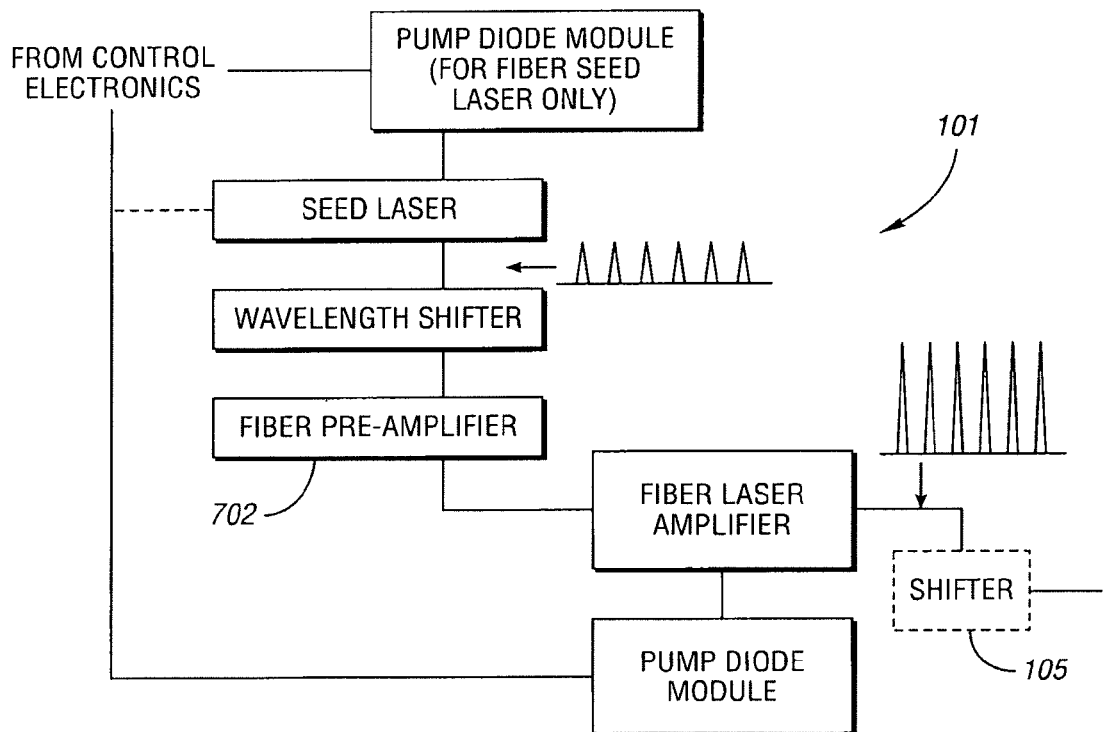
Figure 7C:
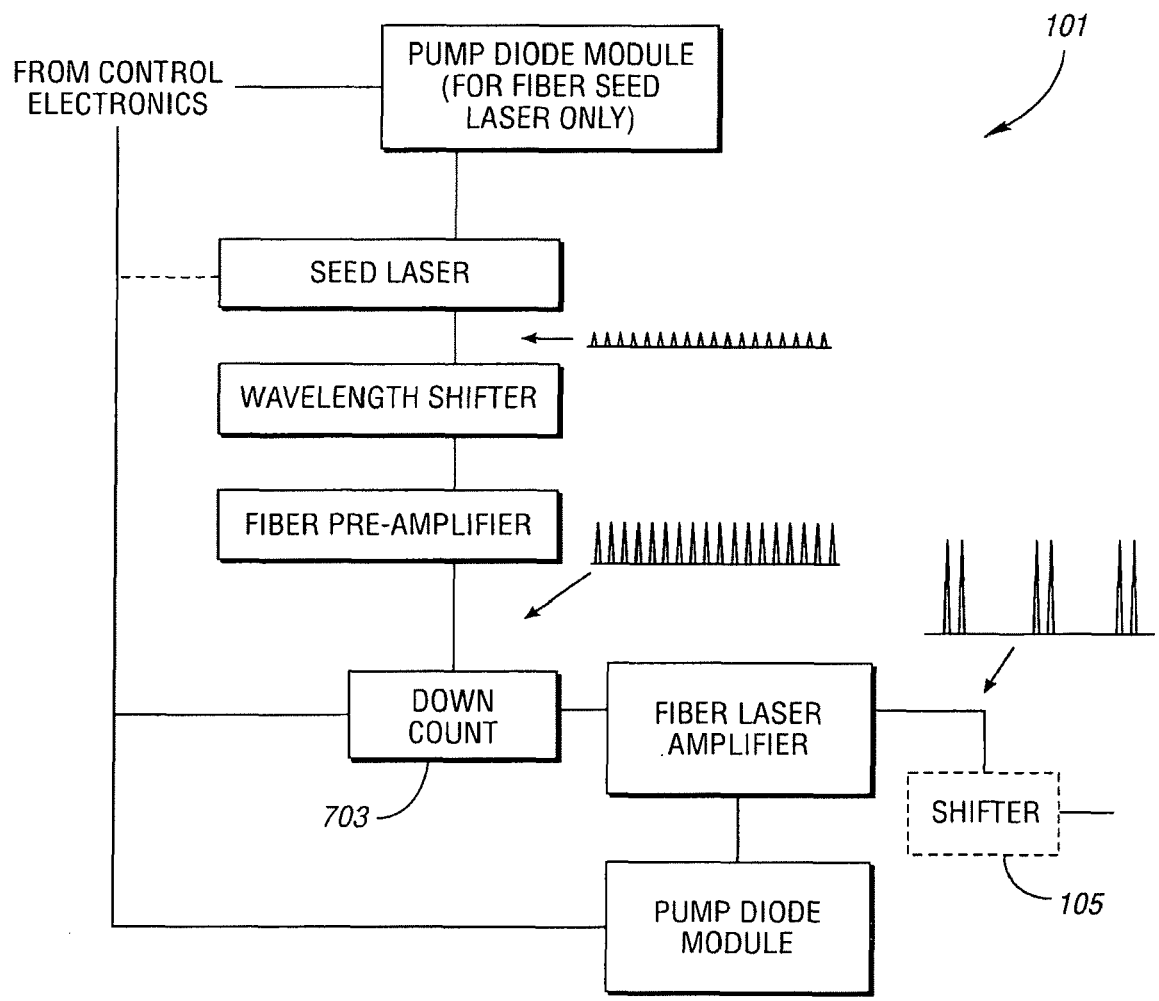

Referring to FIGS. 7a-c, block diagrams illustrating various alternative configurations which may be used within laser sub-system 101 are shown. In FIG. 7a, a wavelength shifter 701 is disposed between the seed laser and the amplifier. In this case, the seed laser wavelength is not the same as that of the power amplifier. Hence, wavelength shifting is implemented to shift the output wavelength from the seed laser to a wavelength within the range of the power amplifier. Examples of the wavelength shifter include Raman shifter, frequency up conversion or down conversion, frequency doubling, etc.

FIG. 7b illustrates yet another configuration wherein a pre-amplifier 702 is disposed between the seed laser stage and power amplifier stage. The pre-amplifier generally amplifies the output of a picosecond seed laser prior to power amplification such that the pulse power is generally within a favorable range for amplification by the fiber laser amplifier (or other suitable amplifier). Preferably, the pre-amplifier is also fiber based.

FIG. 7c illustrates yet a further configuration that includes modulator 703 disposed prior to power amplification. The modulator (e.g., a down-counter or divider) is generally used when the repetition rates are different between the power amplifier and seed laser. Usually, the repetition rate from a mode-locked seed laser is relatively high, in the range of MHz. However, as a result of rated average limited power the repetition rate requirement for the power amplifier may be in the range of a few to hundreds of KHz. Hence, the device operates as a "down-counter" or "pulse picker" (e.g., similar or identical to the modulator sub-system and optical switch of FIGS. 1a and 1b). Preferably, as with modulator sub-system 108, an optical switch is driven with control signals based on position and/or velocity information and therefore synchronized with other components of the laser processing system. An example of such a down-counting device can be an acoustic-optic modulator or other high-speed optical switch. The device may be used alone or in combination with modulator 108 for selecting the pulses to be delivered to the link or other target structure. A wavelength shifter 105 may be disposed at the output as shown in FIGS. 7a-c.

Figure 8C:
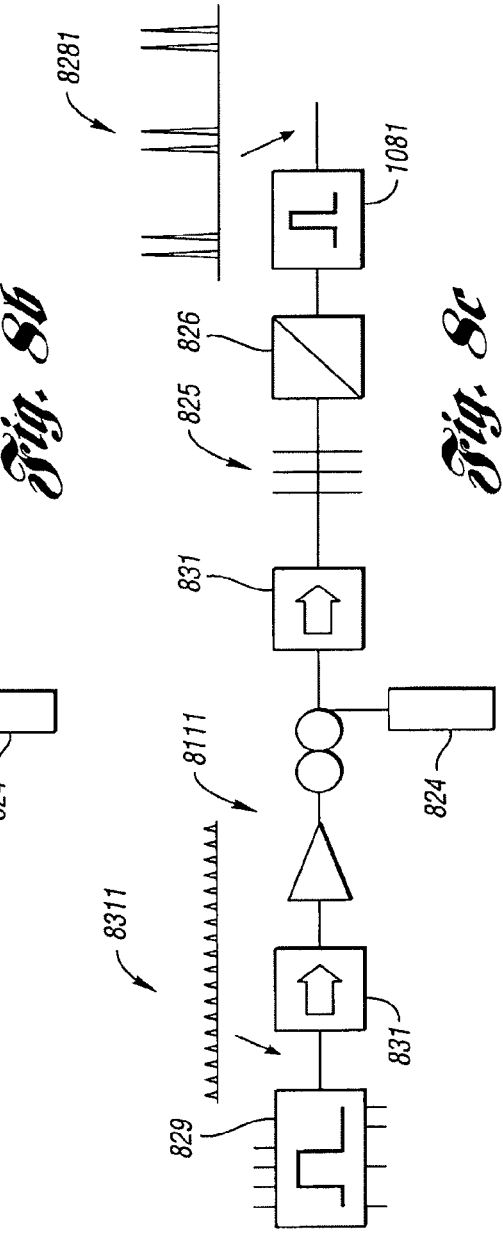
Figure 8B:
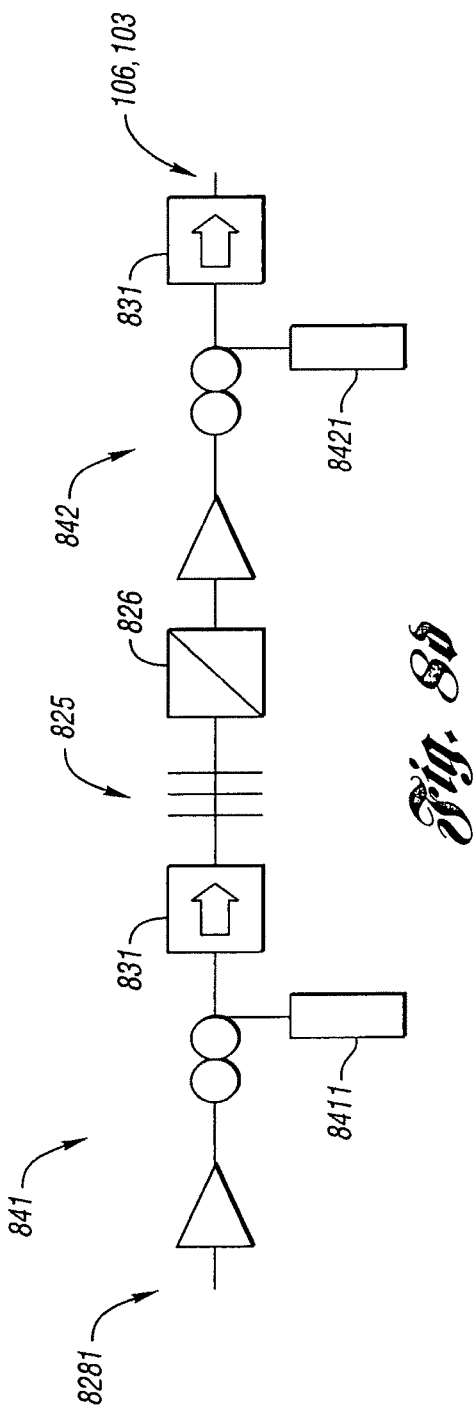
Figure 8C:
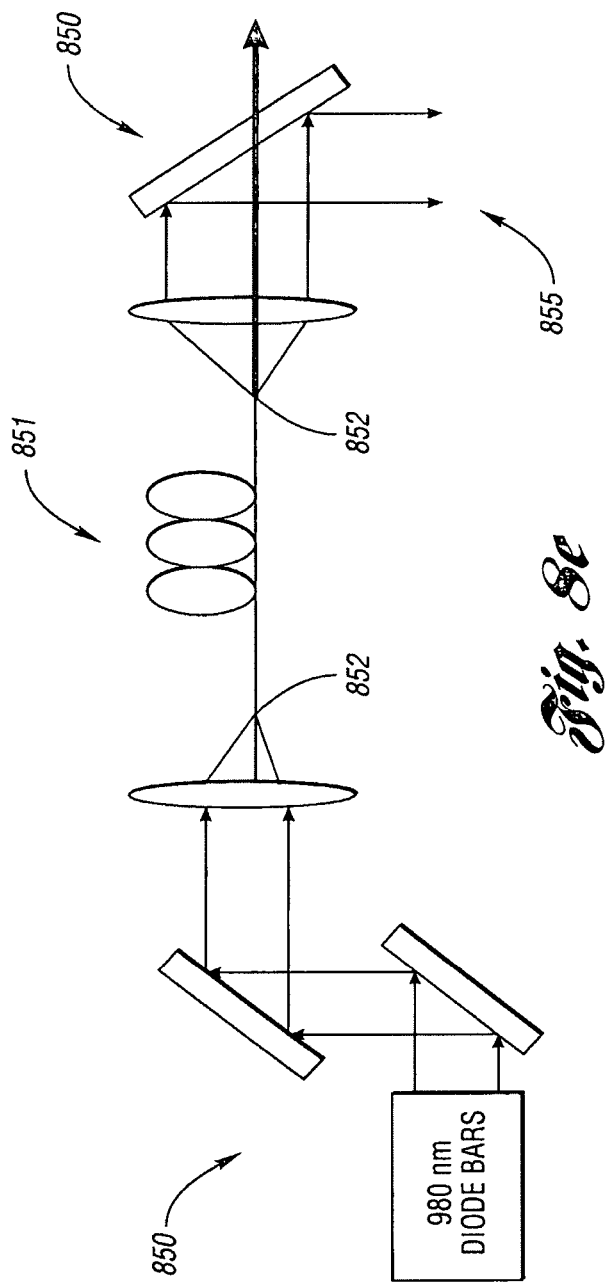

Referring to FIGS. 8a-c, schematic block diagrams illustrating in further detail, constructions of exemplary laser systems which may be used in embodiments of the present invention are shown. By way of example, the seed laser may be a commercially available semiconductor laser diode and the amplifier system includes at least one fiber-optic amplifier, and may include several stages of amplification.

FIG. 8a illustrates a seed laser with a multi-stage amplifier arrangement. Generally, the seeder (oscillator) generates pulses of picosecond duration (10 ps-1 ns) with an adjustable (i.e., modifiable, selectable, etc.) repetition rate up to 100 KHz or 10 MHz. A typical unit may have 40-50 ps duration with a 100 KHz repetition rate. Both pre-amplifier and power amplifier stages are included. A fiber based, preferably single mode, pre-amplifier 8111 generally amplifies the pulses from the seeder to a level that leads to saturation in the final fiber power amplifier 8112 (which may be a multi-stage amplifier). The fiber based power amplifier is generally configured to produce output energy level in the range of about 5 microjoules to 50 microjoules, which is generally sufficient to remove the link with a single pulse and compensate for losses within an optical system. For an output wavelength of 1 micron, Ytterbium doped fiber is generally chosen. The fiber may be polarization-maintaining (PM) fiber.

FIG. 8b shows additional details of one construction of an alternative configuration which may be included in an embodiment of the invention. A modulated laser diode 821 may generate nanosecond pulses (two pulses 8211 shown, not to scale). Each of the pulses may be in an energy range of 1-200 nj, each with an exemplary pulse width of about 2-10 ns. A q-switched microlaser may be used as an alternative to the diode, and the tradeoffs between the choices may be based on specific design considerations and criteria. An isolator 831 is generally used to reduce the noise level, for instance noise caused by back reflection. The pulses are then amplified by diode-pumped (pump diode(s) 824) and Yb amplifier 822. The amplification may be about 30 dB to raise the pulse energy to the microjoule range and to overcome various losses within the system.

A second isolator 831 is generally used to reduce the noise level caused by back reflection. A polarizer 826 is generally used to maintain the polarization of the beam to meet design criteria and Fiber Bragg Gratings (FBG) 825 are used as wavelength sensitive filters. The pulse width may then be "sliced" to the picosecond range using a very high-speed GHz intensity modulator 827, preferably with a full-power bandwidth of at least 10 GHz. Alternatively, a more efficient arrangement may be implemented with a Mach-Zehnder modulator as 827 wherein the nanosecond pulses are compressed to the picosecond range, producing a pulse width in the approximately 10 ps range. Amplified output pulse(s) 8271 are shown (not to scale) with removed or compressed portions depicted by dashed lines. In this case the amplifier 822 is operated at the final required repetition rate.

FIG. 8c shows details of a construction of an alternative seed-amplifier and "pulse picker" configuration which may be included in an embodiment of the invention. Overall, the configuration of FIG. 8c is similar to that of FIG. 7b, but without wavelength shifting, for instance. Pico-second pulses 8311 may be generated directly from a seed diode 829 or by external modulation (not shown) of a seed diode 829 at a multiple of the final required repetition rate (e.g., a multiple of 1-100 KHz). The pulse energy may typically be about 1 nj. As above, the signal is generally amplified (e.g., by about 30 db) with amplifier 8111, before the pulse repetition rate is reduced to the required final value by using a suitable modulator 1081 as a "down counter" or "pulse picker" (e.g., 1-100 KHz). The selected pulse(s) 8281 are shown.

The selected picosecond pulses 8281 may then be amplified with additional stages. FIG. 8d shows one of the configurations of a two-stage amplifier. As described above, components may include isolators 831 to reduce the noise level, a polarizer 826 to maintain the polarization of the beam, and Fiber Bragg Gratings 825 as wavelength filters. Both fiber amplifiers 841 and 842 are generally pumped by diodes (or diode arrays) 8411 and 8421 respectively. The first stage may be a 30 dB, single mode, Yb amplifier. The second stage may be a "large mode" or "large core" Yb amplifier with 30 dB gain. Various methods known in the art may be used to control the output mode and corresponding beam quality, and for noise (ASE) suppression (e.g., see U.S. Pat. Nos. 5,818,630 and 5,400,350, and WO 98/92050) so that a nearly diffraction limited output beam is produced for delivery to the link. The three-stage system of FIGS. 8c-8d may produce outputs in the range of tens—hundred microjoules with beam quality that is approximately diffraction limited.

Methods and systems of delivering pump energy to fiber amplifiers are well known. FIG. 8e shows, by way of example, one of the methods of coupling the diode laser energy into a fiber amplifier. Dichroic mirrors 850 in combination with an optical system (e.g., lens system) may transmit the pump light into Yb-doped, double clad fiber 851 through perpendicularly cleaved fiber ends 852. The amplifier output may be transmitted with a similar dichroic arrangement wherein pump energy 855 is recirculated through fiber. Skilled persons will appreciate and understand other possible appropriate combinations of different types of laser sources for seed and amplifier lasers may be implemented to meet the design criteria of a particular application.

Exemplary Fiber Laser Specification

In at least one embodiment a semiconductor seed laser diode may be used with one or more fiber optic amplifiers. The pulse repetition rate may be in a range of about 60 MHz to 100 MHz, or greater. The number of pulses for processing a single link may be adjustable to over 100 pulses. Link processing at a rate of up to about 150 KHz (150 KHz burst repetition rate) is preferred. A selectable pulse width is also desirable. Available pulse widths are preferably less than 100 picoseconds, for example in a range of about 30 picoseconds to 60 picoseconds, or shorter. Available single pulse energies of about 0.02-0.5 microjoules provide sufficient energy for fine-pitch link processing, and may be attenuated for application to the target with an output acousto-optic modulator. Individual pulse energies of the burst may range from 0.1 nanojoules to 100 nanojoules in many suitable embodiments, depending on the number of pulses applied and the total energy of the burst. Pulse to pulse stability of a few percent or better is desirable. High output beam quality of $M2=1.1$ provides for nearly diffraction limited spot distributions.

In at least one laser diode-fiber amplifier embodiment the envelope shape and duration may be adjusted. For example, a square shape, or envelope with gradual decay may be produced. Such a shape may be useful to increase the process energy window. The shape and or duration may be modulated by modulating the seed laser diode or by controlling the amplifier pump diodes.

In some laser-diode fiber based embodiments an IR laser output will be shifted to a shorter visible or near IR wavelength. As mentioned earlier, a laser wavelength within subsystem 101 will generally be in a range of about 0.150 microns to 1.3-1.55 microns, the latter range corresponding to diode laser wavelengths used in high-speed telecommunications. In one example, the laser wavelength may be frequency multiplied (e.g., tripled) or Raman shifted with shifter 105 to a near IR, visible, or UV wavelength. The latter 1.55 µm wavelength may be most preferred as diode and fiber technology for telecommunication may be utilized. Frequency doubling will therefore produce a near IR wavelength of about 0.75 µm, and a corresponding spot size suitable for improved processing of very fine pitch links.

A laser system having the exemplary laser diode-fiber amplifier specifications may be produced by IPG Photonics Corp. of Oxford, Mass. or other manufacturers of fiber laser systems.

Memory Repair System

Figure 9:
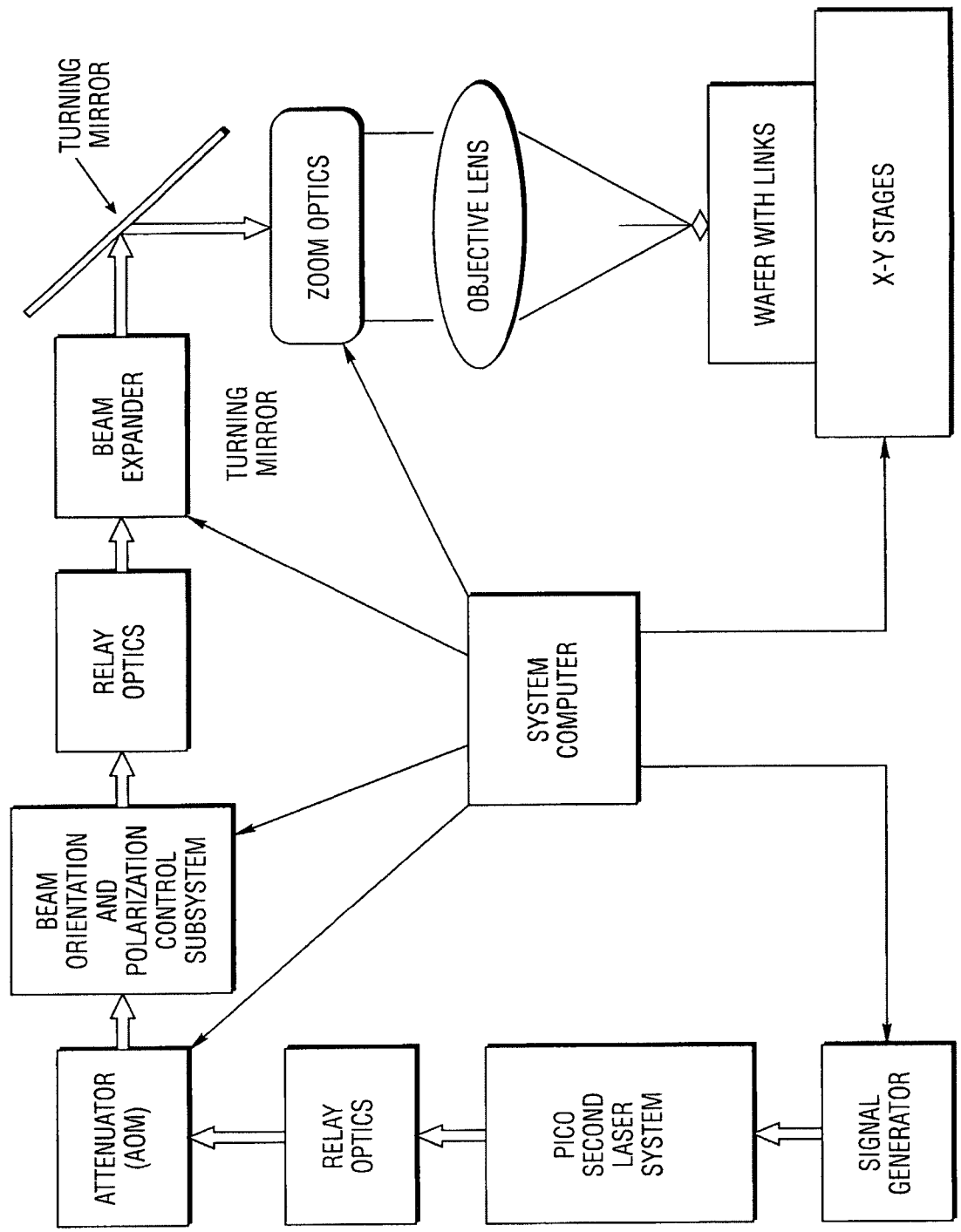
FIG. 9 is a block diagram of a laser based memory repair system, including a picosecond laser system, and further showing an example implementation of the present invention.

Referring to FIG. 9, a block diagram of a laser based memory repair system, including a picosecond laser system, and further illustrating numerous major system components of the present invention is shown.

Complete micromachining stations using pico second lasers may be implemented. At least one embodiment of a picosecond laser system may be integrated into the M430 series manufactured by GSI Lumonics, or other micromachining systems having suitable sub-micron tolerances and performance specifications for high-speed micromachining. The following list of attached patents and published applications, assigned to the assignee of the present invention, describe numerous aspects related the memory repair methods and systems:

1. U.S. Pat. No. 5,300,756, entitled "Method and System for Severing Integrated-Circuit Connection Paths by a Phase Plate Adjusted Laser beam";
2. U.S. Pat. No. 6,144,118, entitled "High Speed Precision Positioning Apparatus";
3. U.S. Pat. No. 6,181,728, entitled "Controlling Laser Polarization";
4. U.S. Pat. No. 5,998,759, entitled "Laser Processing";
5. U.S. Pat. No. 6,281,471, entitled "Energy Efficient, Laser-Based Method and System for Processing Target Material";
6. U.S. Pat. No. 6,340,806, entitled "Energy-Efficient Method and System for Processing Target Material Using an Amplified, Wavelength-Shifted Pulse Train";
7. U.S. application Ser. No. 09/572,925, entitled "Method and System For Precisely Positioning A Waist of A Material-Processing Laser Beam To Process Microstructures Within A Laser-Processing Site", filed May 16, 2000, and published as WO 0187534 A2, December, 2001, now U.S. Pat. No. 6,483,071, Division of Ser. No. 09/572,925;
8. U.S. Pat. No. 6,300,590, entitled "Laser Processing"; and
9. U.S. Pat. No. 6,339,604, entitled "Pulse Control in Laser Systems".

As apparent from the teachings herein, the present invention provides for processing of links with pitch of less than 2 microns with a negligible heat affected zone, and without the complexity of a femtosecond laser system. Precise link removal may be facilitated with one or more picosecond pulses. Further, link removal may be accomplished with high efficiency when compared to a slow etching process, and with improved precision when compared to conventional nanosecond link processing approaches. Link processing in accordance with the present invention may be carried out in a high-speed laser processing system.

EXAMPLES

Comparative Data and Additional Processing Methods

In "Link Cutting/Making" in HANDBOOK OF LASER MATERIALS PROCESSING, Chapter 19, p. 599, Laser Institute of America (2001), it was noted that an energy study reveals a range of suitable pulse energies for a particular process. A figure of merit referred to as the "laser energy process window" is typically used to characterize link blowing performance. A typical study blasts several links on a representative wafer beginning with a low energy level that begins to cut links successfully, $E_{low}$. Subsequent links are blasted at successively higher levels until a pulse causes substrate or neighbor link damage, $E^{high}$. The range between the lowest energy that blows a link and the highest energy pulse that did not damage the substrate or neighboring link is the "energy window." Neighbor link and surrounding (e.g., underlying) dielectric damage are both significant factors, of increasing importance for processing fine pitch structures.

The relative laser energy process window is a similar figure of merit. It is a dimensionless, normalized measure:

$$\text{Relative Energy Process Window} = (E_{high} - E_{low})/(E_{high} + E_{low})$$

The relative window therefore provides a measure that reduces dependence on several factors, including variability among laser systems and wafer manufacturing conditions. Generally speaking, laser beam conditions that produce a relative energy process window of greater than 30% and, more preferably, greater than 40% are advantageous for laser link processing because link processing is successfully performed as processing conditions vary over time and over different production runs.

Test wafers were manufactured for picosecond pulsed laser experiments with 4 different fuse pitch structures (1.0, 1.35, 1.7 and 2.0 μm). The fuses for this study were approximately 0.35 μm wide and 0.4 μm thick Al structures (1% Si, 0.5% Cu). The Al fuses were overcoated with 0.05 μm thick TiN/Ti layers and undercoated with a 0.02 μm thick Ti layer. A passivation layer, consisting of approximately 0.1 μm of $SiO_2$, remained on top of the metallization after a controlled oxide etching process to ensure a reliable laser cutting process.

In one series of experiments, the system used to perform the experiments was based on a GSI Group M 450 Wafer Repair System. The experimental system included a mode-locked solid state laser at 1.064 micron wavelength with a 50 MHz frequency, resulting in a 20 ns temporal spacing between consecutive pulses. The available laser system output pulse widths were 57 ps, 35 ps, and 8 ps. With a series of N=50 pulses the total duration (burst time) was 1 microsecond. The intensity profile (temporal shape) of the laser output could be non-uniform or uniform, and is a factor that may affect processing. The laser pulses were focused to a minimum $1/e^2$ spot size of approximately 1.35 μm. The M450 precision wafer stage was used, and the speed of the stage relative to the laser pulses resulted in about 0.1 μm or less displacement of a link during the 50 pulses. If the duration of the burst is somewhat less than about 1 microsecond, it is not necessary to slow the speed of on-the-fly processing. For example, with stage speed of 100 mm/sec, a displacement of 0.1 μM will occur in 1 microsecond, and in 500 nanoseconds if the speed is increased to 200 mm/sec. However, if the burst duration is too short, a few hundred nanoseconds or less for example, it may not be possible to fit in an appropriate number of pulses with appropriate inter-pulse spacing for efficient link blowing. Durations longer than about 1 microsecond can be utilized if desired by slowing the relative stage/beam motion or by using a beam deflector that keeps the beam over the link during the longer burst.

The number of pulses applied to a given link could be varied with the use of an acousto-optic modulator for pulse selection. It was determined that 50 pulses were optimum for processing the test wafer at 1.064 micron laser wavelength, and included consideration of the 0.1 μm displacement or less of the pulses as above.

Comparative results for individual multi-nanosecond range pulse widths and bursts of multi-picosecond range pulse widths are illustrated in FIGS. 10a, 10b, 11a and 11b.

Nanosecond Single Pulse Processing

Figure 10A:
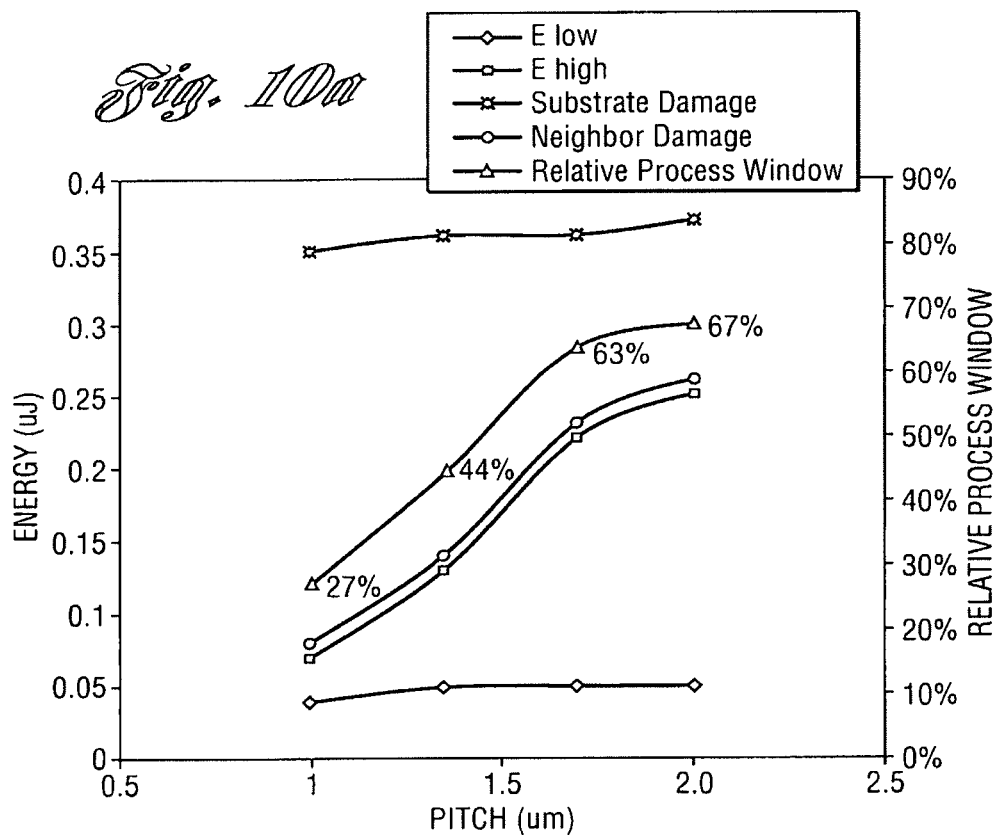
FIGS. 10a and 10b are graphs of energy and relative process window versus pitch which illustrate test results for link blowing with individual pulses having 21 nanosecond and 9 nanosecond pulse widths, respectively.
Figure 10B:
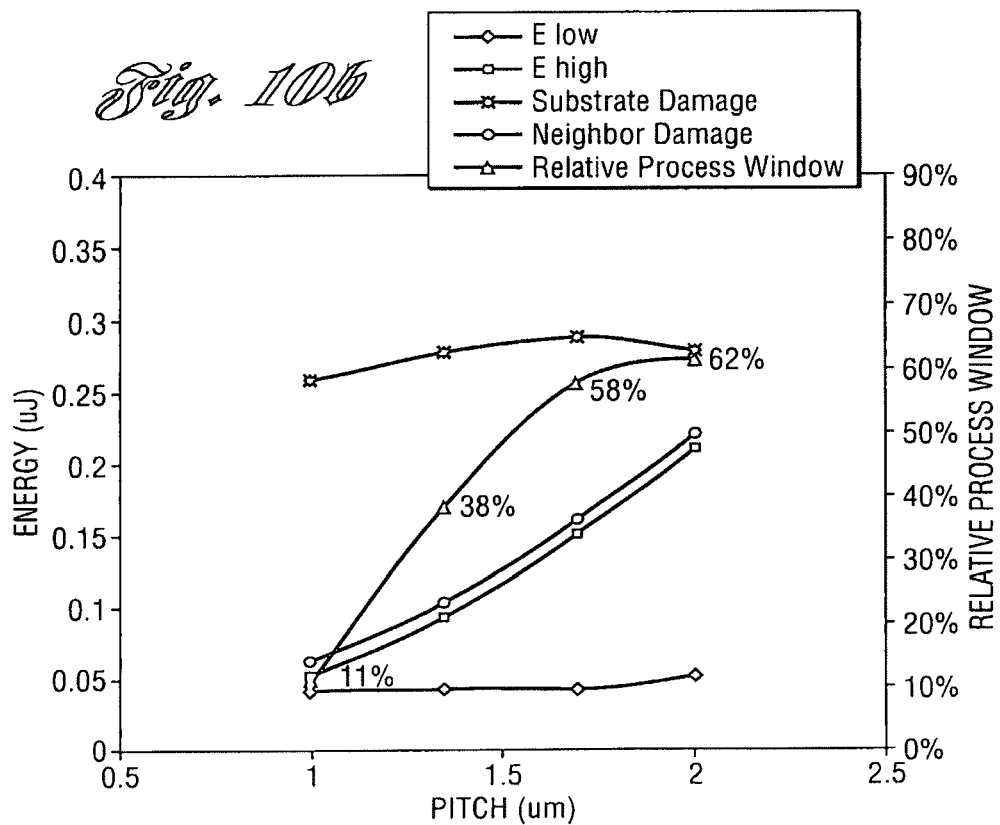

FIGS. 10a and 10b display the energy levels for each criteria, as well as the relative process window, from experiments with 21 ns and 9 ns single IR laser pulses, respectively. These show laser link processing capability using conventional nanosecond laser pulses (one pulse per link). Values for relative process windows are labeled and refer to the second Y-axis on the right hand side.

The high ends of laser energy process windows are limited by the neighbor link damages throughout all the structures for both cases. Relative process windows were ranged at 27~67% and 11~62% for 21 ns and 9 ns, respectively. Laser energy gaps between the adjacent link and Si substrate damages for each structure are larger in the case of 21 ns, than is the case with 9 ns. That is because a longer pulse gives more time for the heat generated by laser beam to diffuse within the Si substrate. A lower peak power of the pulse at the equivalent energy level is also considered to help. Both effects are beneficial to avoiding Si substrate damage. On the other hand, lower peak power of a 21 ns pulse caused the adjacent link damage to occur later than does a 9 ns pulse, but not as significant as is the case of Si substrate damage.

Picosecond Pulse Bursts

Figure 11A:
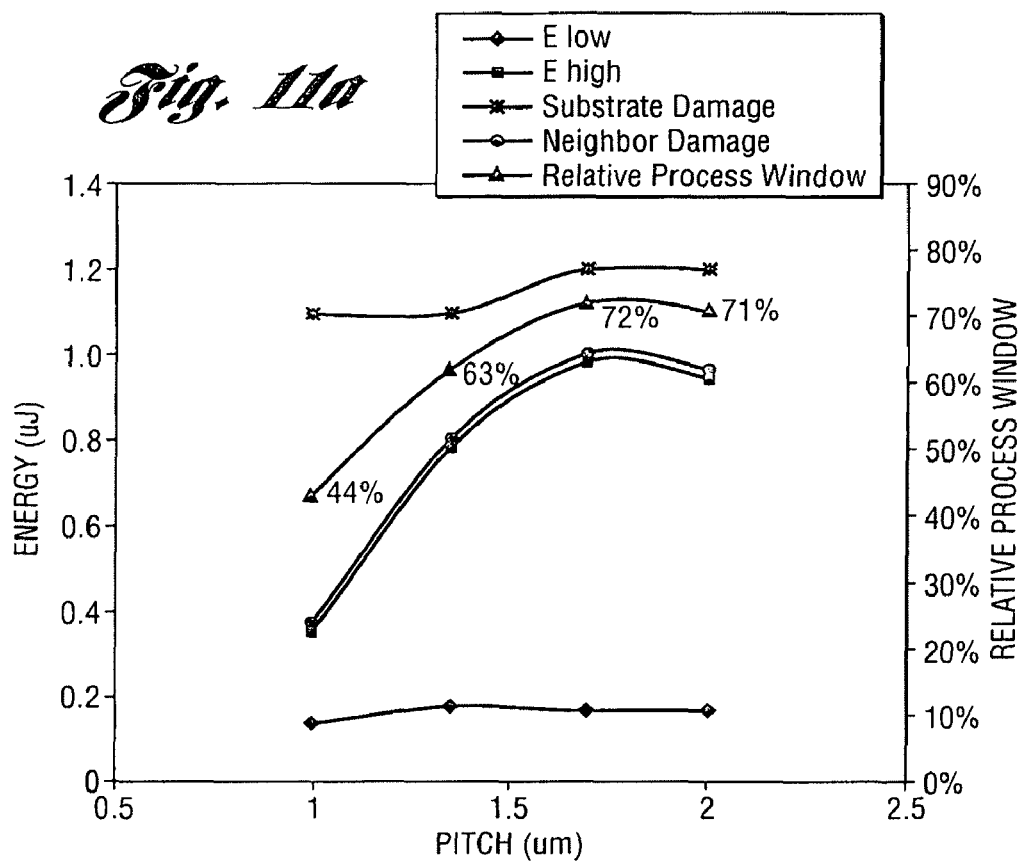
FIGS. 11a and 11b are graphs of energy and relative process window versus pitch which illustrate test results for link blowing with 50 pulse sets of 57 picosecond pulses and 35 picosecond pulses, respectively.
Figure 11B:
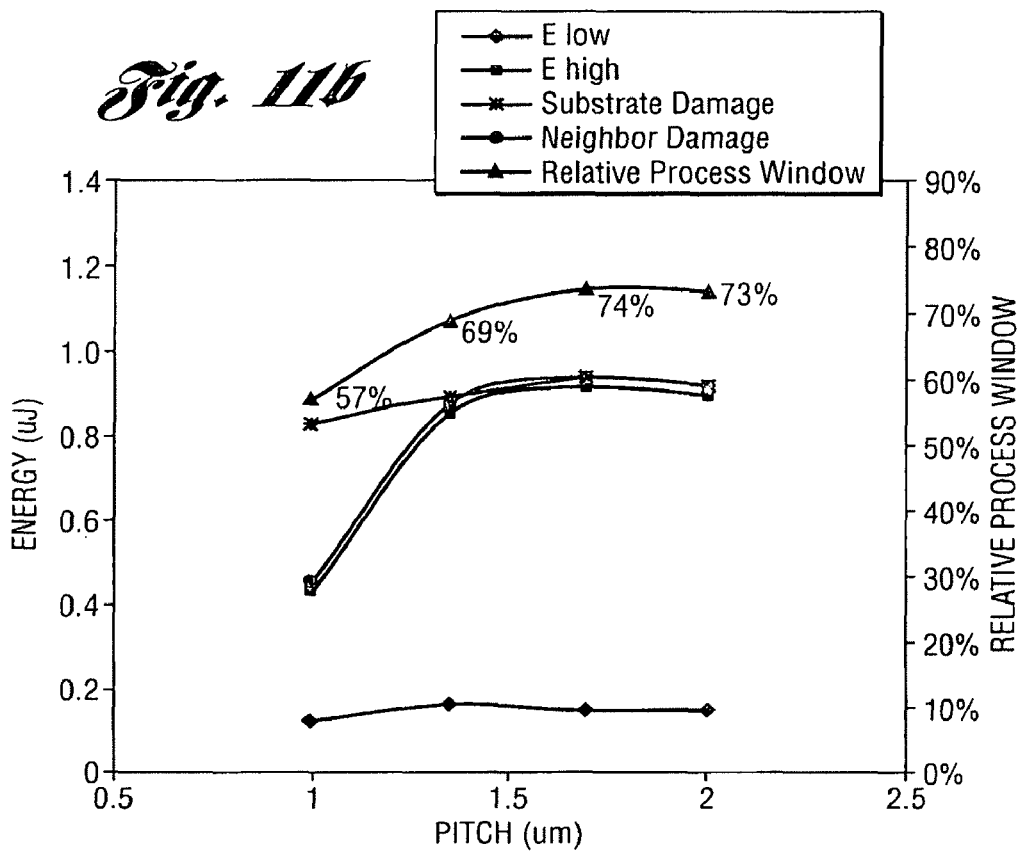

FIGS. 11a and 11b display the results of link structures processed with a sequence of 50 pulses at 57 ps and 35 ps, respectively. The pulse frequency was 50 MHz. Therefore, the time spacing between the pulses was 20 ns and the pulses were applied for a 1 µsec duration (burst time).

It is noted that multiple pulses were applied to each targeted link during fine stage motion. Therefore, a slight shift of the laser beam over the targeted link during each burst occurred. With a current speed of precision stage and link pitches, the shift of 50 pulses was 0.1 µM or less. Increasing the frequency (decreasing spacing between pulses) and/or using a deflector to compensate for motion are alternatives for increasing the number of pulses applied to a link while maintaining small shifts of the beam spot across the link during burst application.

Results from 57 ps pulse width show that the process windows were significantly improved from data from nanosecond laser pulses that were shown in FIGS. 10a and 10b. Results from 57 ps pulse width for most of structures show significantly increased high bounds of energy process window ($E_{high}$), whereas the increases of low bounds ($E_{low}$) were relatively moderate. The relative process window runs from 44~72% and the improvement is especially noticeable for fine pitch structures (1.35 µm and less pitched structures). Compared with the results of 21 ns laser pulse processing (0.27 and 0.44), 63% and 43% improvements in relative process window were achieved for the structures pitched at 1.0 µm and 1.35 µm, respectively.

In FIG. 11a, it is interesting to see that the gaps between the adjacent link and Si substrate damages became relatively closer than the data from the cases of nanosecond laser pulse. This is because of the great improvement from neighbor link damage levels, even though the major failure mode was still neighbor link damage throughout the pitches as was the case of nanosecond lasers. Although several interaction mechanisms may occur at the picosecond scale, the results suggest a smaller effective spot size was created by "thresholding." The effective spot size is considered to be much smaller than the theoretical optical diffraction limited spot size calculation. Therefore, the adjacent link damage was reduced compared with nanosecond laser pulses. High bounds of process window were significantly improved. Multiple pulse thresholding technique may also be beneficial for preventing the Si substrate damage underneath the link structure. Thresholding on the adjacent links was thought to be slightly less efficient than on Si substrate in the 57 ps laser pulse case, and the adjacent link damage limited the high bound of the process window.

FIG. 11b displays that the high bounds of the process windows were limited by combinations of the two failure modes in the cases of 35 ps pulse width (except for the 1 µm pitched structure). In other words, data points for structures pitched from 1.35.about.2.0 µm show that the substrate damage coincides with the neighbor damage.

Another set of experiments were conducted with a shorter laser wavelength. In these experiments, 532 nm (green) light was used in picosecond bursts. The shorter wavelength has the advantage of smaller diffraction limited spot size, but since the substrate absorption is dramatically increased over IR wavelengths, it is difficult if not impossible to predict suitable pulse characteristics based on IR test results. In these experiments, various numbers of 35 picosecond pulses separated by 20 nanoseconds were applied to target links as described above except the wavelength was 532 nm and the motion stage was slowed to apply larger numbers of pulses to the links.

Figure 12A:
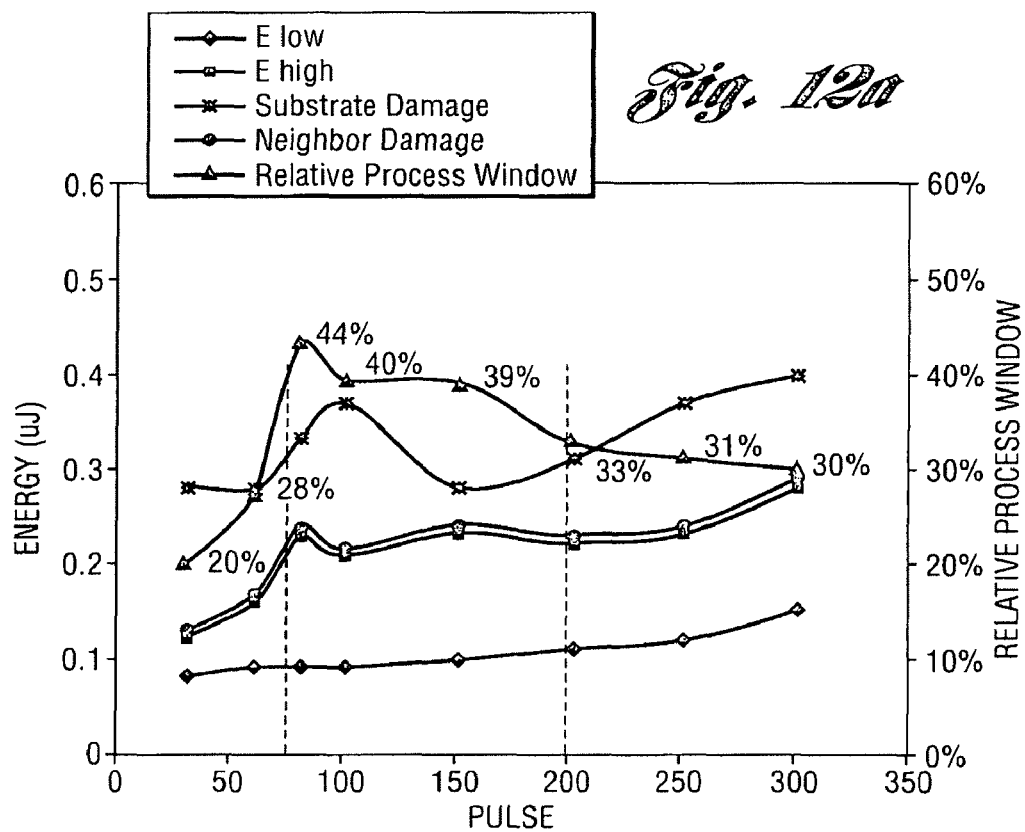
FIGS. 12a and 12b are graphs of energy and relative process window versus number of pulses which illustrate test results for link blowing with sets of 35 picosecond pulses at about 532 nanometer wavelength with 1 µm pitch and 1.7 µm pitch, respectively.
Figure 12B:
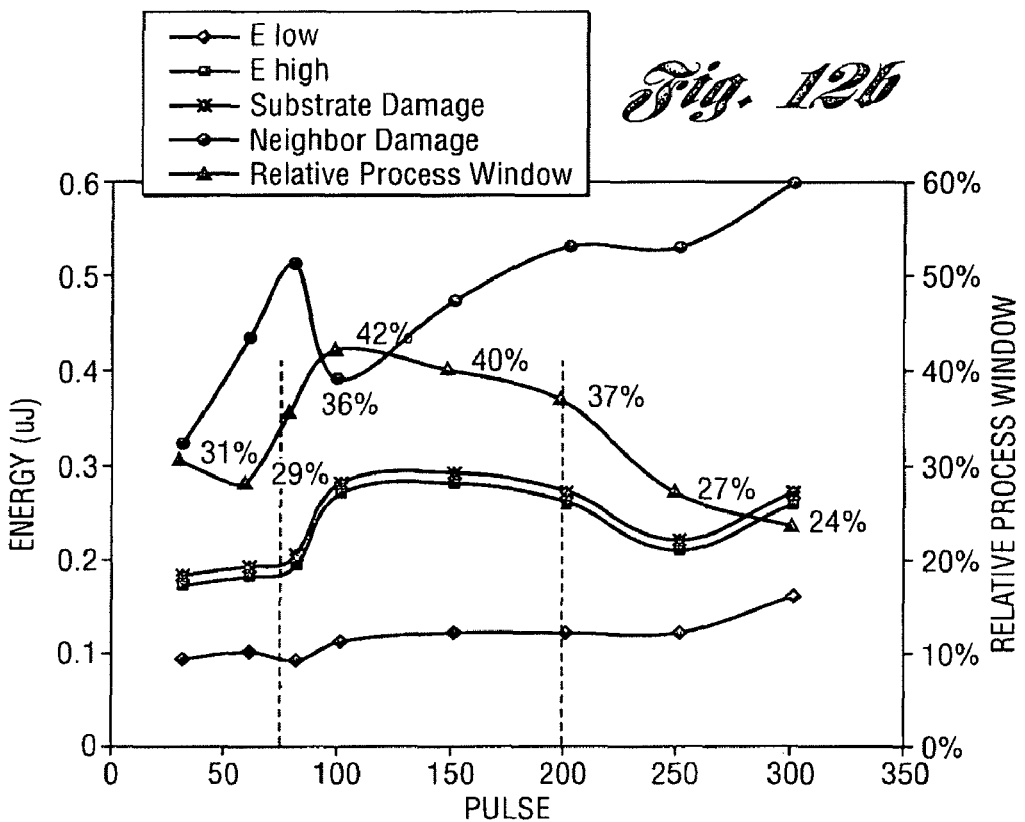

Energy windows as a function of the number of pulses applied to 1 micron pitch links and 1.7 micron pitch links are illustrated in FIGS. 12a and 12b, respectively. At 1 micron link pitch, the high energy limit is bounded by neighbor damage, whereas at 1.7 micron link pitch, the high energy limit is bounded by substrate damage. In both cases, however, peaks in the energy window are observed in the range from about 70 pulses to about 200 pulses per link. This illustrates that, especially for finer pitch structures and shorter laser wavelengths, a relatively large number of pulses, e.g. 70 pulses or more, is desirable for reliable link blowing.

General Conclusions

Generally, the above results at 50, 70, or more pulses show a significant improvement in the energy window results when using bursts of picosecond pulses as compared to single pulse nanosecond processing. For fine pitch links, shorter wavelength and large numbers of pulses is advantageous. Reduced neighbor link damage was particularly significant. Although several interaction mechanisms may occur at the picosecond scale, the results suggest a smaller effective spot size (below diffraction limit) was created by "thresholding."

For a fixed number of pulses, N, and integrated burst energy, material removal at decreasing pulse widths generally requires higher peak pulse power. However, the increased peak power may increase the chance of substrate damage. Therefore, more pulses with lower energy per pulse and longer bursts may be required to optimize the energy window. On the other hand, if the energy is too low, for instance below an ablation threshold, material removal may not occur at longer pulse widths, or link severing may be incomplete [10] [11].

A pulse width may be in the range of up to about 100 ps, with 10-100 picoseconds being typically suitable. Generally, pulse widths on the order of about 1 picosecond or greater are advantageous due to laser cost and complexity concerns. As noted above, good results have been obtained for some particular link and substrate structures with pulse widths between 30 ps and 60 ps. In some embodiments, a pulse width may be in the range of a few picoseconds to about 50 picoseconds. The power density of a pulse will generally be greater than $10^9$ W/cm$^2$ and may preferably be in a range of about $10^{10}$-$10^{12}$ W/cm$^2$ for picosecond processing. The processing of some link structures may be best with pulses having power density somewhat greater than $10^9$ W/cm$^2$, and up to about $10^9$ W/cm$^2$.

Over a range of pulse widths, the maximum achievable process energy window will generally be determined by a tradeoff between substrate damage and adjacent link damage. If the peak power is increased at the shorter pulse widths cleaner link removal may be achieved, but with a risk of substrate damage. At some intermediate pulse widths a best compromise may be achieved. Longer pulse widths may reduce the substrate damage, but result in incomplete removal and debris ("splatter"). The longer pulse widths may also decrease the window as a result of neighbor link damage (although the neighbor damage will be much less than obtained with nanosecond pulses).

In magnified visual observations, cut sites processed with a pulse width of 8 ps appeared to be the cleanest cut sites, however, Si substrate damage limiting the process window occurred at energy levels lower than the cases of 35 ps and 57 ps pulse widths. The high peak power from the 8 ps pulse at the fixed N caused substrate damage.

With a laser pulse width of 35 ps, some splatter around the cut sites was observed, but these cut sites appeared to be cleaner than cut sites processed with a 57 ps pulse width. As in nanosecond laser pulse width cases, the splatter problem using picosecond laser pulse widths increased with an increase of pulse width.

The theoretical optimum pulse width may be determined by analyzing the failure modes together to find the maximum process window. For the case of N=50 and a 50 MHz mode-locked frequency, and with a laser pulse width of 8 ps the upper bound of the process window was limited by Si substrate damage. With 57 ps pulse width, the upper bound of the process window was limited by the neighbor link damage. Results from 35 ps pulse width show moderate compromise between Si substrate damage and neighbor link damage and the relative process windows show the best results considering these two failure modes for most structure with a process window range of about 57~74% for 1.0~2.0 mm pitched structures. This is considered to be an acceptable window for the implementation into current production.

In accordance with at least one embodiment of the present invention, increasing the number of pulses (N) in a burst with negligible position shift is expected to improve the process window, reducing the substrate damage that occurs with decreasing pulse widths and corresponding higher peak power. A high speed beam deflector (i.e.: electro-optic or acousto-optic modulator) may be used to compensate for the motion, preferably in combination with an increased laser repetition rate (up to a practical limit wherein vapor/plasma/plume for a previous pulse affects coupling of energy to the link).

In at least one embodiment for processing very fine pitch link structures, the number of pulses applied to a link may exceed 50 pulses, and may be in the range of about 70 or more pulses per link. 70-200 pulses has been found advantageous, as noted above.

In at least one embodiment, the repetition rate may be about 100 MHz or greater, for instance in the range of 100 MHz to 500 MHz. At such higher frequencies, a larger number of pulses will be delivered to a link in a shorter period of time. However, the frequency should not be so high that coupling of energy to a link is degraded as a result of ejected vapor/plasma/plume that follows a previous pulse.

In embodiments where the number of pulses is relatively large, for instance where the pulses are applied over a time interval of a greater than one microsecond and up to a few microseconds, the motion of the stage relative to a link may exceed an acceptable specification for spot placement. In at least one embodiment, some of the laser pulses may need to be deflected during the burst to compensate for the relative motion.

Various laser-based system configurations are shown and described herein and may include visible and near-UV wavelengths. The short wavelengths provide for further effective spot size reduction compared to IR lasers.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A laser-based method of removing a target link structure of a circuit fabricated on a substrate without causing undesirable damage to the substrate, any dielectric layers between the target link structure and the substrate, or link structures adjacent to the target link structure, the target structure being in a set of link structures, at least some link structures being separated by a pitch of less that 2 microns, the method comprising:
   generating a sequence of laser pulses at a first repetition rate of greater than about 1 MHz utilizing a seed laser having a first predetermined wavelength;
   optically amplifying at least a portion of the sequence of laser pulses to obtain an amplified sequence of laser pulses comprising a burst of output pulses within a burst envelope shape;
   controlling pulse characteristics whereby the burst envelope shape comprises a desired envelope shape; and
   delivering and focusing pulses of the burst onto the target link structure during relative motion of the substrate and the focused pulses, substantially all output pulses of the burst having a pulse duration of less than about 1 nanosecond, corresponding to pulse power densities in the range of at least $10^9$ W/cm$^2$ to less than about $10^{12}$ W/cm$^2$ at the target link structure, and a wavelength of about 1.2 microns or less, wherein the power density of the focused pulses is low enough to avoid undesirable damage, and wherein interaction between the laser pulses and the material is a thermal process.

2. The method of claim 1, comprising generating seed laser pulses for amplification, and modulating seed pulse energy.

3. The method of claim 2, comprising optically modulating seed laser output pulses.

4. The method of claim 1, comprising controlling pulse spacing within the burst.

5. The method of claim 4, comprising controlling a trigger signal delay digitally.

6. The method of claim 5, wherein controlling the trigger signal delay changes the envelope shape in a range from a substantially overlapping combined shape envelope to a spaced sequence of non-overlapping burst shapes.

7. The method of claim 1, comprising controlling amplifier pump diode energy.

8. The method of claim 1, comprising pulse slicing.

9. The method of claim 1, comprising pulse compression.

10. The method of claim 1, comprising pre--amplifying seed pulses.

11. The method of claim 1, comprising counting down from the first repetition rate to select pulses comprising a sequence of bursts occurring at a reduced second repetition rate of at least 20 KHz, wherein each burst has a desired shape envelope.

12. The method of claim 11, comprising selecting synchronized pulse bursts corresponding to selected target links.

13. The method of claim 1, comprising spacing pulses within the burst by a spacing of at least a full width half maximum of one pulse in the burst.

14. The method of claim 1, wherein the burst comprises a predetermined number of pulses separated by predetermined pulse spacing, whereby the burst shape comprises a predetermined envelope duration.

15. The method of claim 14, wherein each pulse in the burst comprises a predetermined pulse width and pulse energy, whereby the peak power of each pulse conforms to the desired envelope shape.

16. The method of claim 15, wherein the total energy of all the focused pulses in the burst is high enough to remove the target link structure while also avoiding the undesirable damage to other link structures in the set of link structures.

17. The method of claim 1, wherein substantially all output pulses of the burst have a pulse duration of less than about 100 picoseconds.

18. The method of claim 17, wherein substantially all output pulses of the burst have a pulse duration of more than about 10 picoseconds.

19. The method of claim 1, wherein substantially all output pulses of the burst are separated by at least about 5 nanoseconds.

20. The method of claim 1, comprising measuring an energy window using a set of burst characteristics comprising a fixed total burst energy, and varying at least one other burst characteristic in the set to obtain an optimized set with an increased energy window.

21. The method of claim 1, comprising varying one or more of pulse spacing, envelope duration, number of pulses, pulse energy, pulse width, pulse power, and envelope height.

22. The method of claim 1, comprising generating an amplified burst of laser pulses having an envelope shape comprising a first high power portion followed by a square portion.

23. The method of claim 1, comprising controlling pulse characteristics whereby a second burst envelope shape comprises a desired envelope shape.

24. The method of claim 1, wherein focusing pulses comprises focusing a plurality of spots having at least one non-identical spot distribution or power density.

25. The method of claim 1 wherein focused laser output includes at least one pulse focused to a non-round spot to improve energy enclosure of the focused laser output within the selected target link structure.

26. A system for removing a target link structure of a circuit fabricated on a substrate without causing undesirable damage to the substrate, any dielectric layers between the target link structure and the substrate, or link structures adjacent to the target link structure, the target structure being in a set of link structures, at least some link structures being separated by a pitch of less that 2 microns, the system comprising:
 a seed laser apparatus configured to output laser pulses having a wavelength of about 1.2 microns or less;
 a seed laser modulation system configured to control characteristics of the seed laser pulses to produce separated bursts of laser pulses corresponding to desired burst envelope shapes;
 an optical amplifier configured to receive said bursts as an input and produce amplified bursts having desired envelope shapes as an output; and
 a beam delivery system configured to focus and deliver one or more of the amplified bursts along a beam delivery axis to the target link structure during relative motion between the substrate and the beam delivery axis.

27. The system of claim 26, wherein the seed laser modulation system comprises an optical modulator.

28. The system of claim 26, wherein the seed laser modulation system comprises control electronics configured to control burst pulse spacing, burst pulse number and burst pulse energy.

29. The system of claim 26, wherein the optical amplifier comprises a pre-amplifier.

30. The system of claim 26, comprising a wavelength shifter coupled to the optical amplifier.

31. The system of claim 26, comprising a beam deflector configured to direct an amplified burst to a target link structure within a predetermined tolerance.

32. The system of claim 26, wherein the seed laser apparatus comprises a plurality of lasers and a digitally controlled trigger delay.

33. The system of claim 26 comprising a fiber-based laser system.

34. An amplified seed laser based method of removing a target link structure of a circuit fabricated on a substrate without causing undesirable damage to the substrate, any dielectric layers between the target link structure and the substrate, or link structures adjacent to the target link structure, the target structure being in a set of link structures, at least some link structures being separated by a pitch of less than 2 microns, the method comprising:
 providing one or more control signals to a seed laser modulation system to generate an amplified burst of laser pulses having a desired envelope shape; and
 delivering and focusing pulses of the burst onto the target link structure during relative motion of the substrate and the focused laser pulses, substantially all output pulses of the burst having a pulse duration of less than about 1 nanosecond, corresponding to pulse power densities in the range of at least $10^9$ W/cm$^2$ to less than about $10^{12}$ W/cm$^2$ at the target link structure, and a wavelength of about 1.2 microns or less, wherein the power density of the focused pulses is low enough to avoid undesirable damage, and wherein interaction between the laser pulses and the material is a thermal process.

35. The method of claim 34 comprising a first high power portion followed by a square portion.

36. The method of claim 34, comprising controlling pulse characteristics whereby a second burst envelope shape comprises a desired envelope shape.

37. The method of claim 34, wherein substantially all output pulses of the burst have a pulse duration of less than about 100 picoseconds.

38. The method of claim 37, wherein substantially all output pulses of the burst have a pulse duration of more than about 10 picoseconds.

39. The method of claim 34, wherein substantially all output pulses of the burst are separated by at least about 5 nanoseconds.

40. The method of claim 34, comprising varying one or more of pulse spacing, envelope duration, number of pulses, pulse energy, pulse width, pulse power, and envelope height.

* * * * *